(12) United States Patent
Lee et al.

(10) Patent No.: US 11,646,305 B2
(45) Date of Patent: May 9, 2023

(54) SEMICONDUCTOR DEVICES AND METHODS OF MANUFACTURING THE SAME

(71) Applicant: Samsung Electronics Co., Ltd., Suwon-si (KR)

(72) Inventors: Sungok Lee, Osan-si (KR); Sangdo Park, Yongin-si (KR); Jun Seomun, Seoul (KR); Bonghyun Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 303 days.

(21) Appl. No.: 16/946,620

(22) Filed: Jun. 30, 2020

(65) Prior Publication Data

US 2021/0104508 A1 Apr. 8, 2021

(30) Foreign Application Priority Data

Oct. 2, 2019 (KR) .......................... 10-2019-0122523
Jan. 20, 2020 (KR) .......................... 10-2020-0007272

(51) Int. Cl.
*H01L 27/00* (2006.01)
*H01L 27/02* (2006.01)

(52) U.S. Cl.
CPC ................................ *H01L 27/0207* (2013.01)

(58) Field of Classification Search
CPC ............. H01L 27/0207; H01L 27/0218; H01L 2029/7858
See application file for complete search history.

(56) References Cited

U.S. PATENT DOCUMENTS

| | | | |
|---|---|---|---|
| 9,292,649 B2 | 3/2016 | Lee et al. | |
| 9,576,978 B2 | 2/2017 | Baek et al. | |
| 9,935,100 B2 | 4/2018 | Lim et al. | |
| 10,157,987 B1 * | 12/2018 | Liaw | H01L 29/165 |
| 10,629,706 B2 * | 4/2020 | Liaw | H01L 29/66795 |
| 11,087,831 B2 * | 8/2021 | Liaw | H01L 27/0207 |
| 11,158,632 B1 * | 10/2021 | Liaw | H01L 27/0928 |
| 2005/0104133 A1 | 5/2005 | Kanno et al. | |
| 2018/0231604 A1 | 8/2018 | Kim et al. | |
| 2018/0314771 A1 | 11/2018 | Lee et al. | |
| 2018/0350791 A1 * | 12/2018 | Do | H01L 27/11807 |
| 2018/0365368 A1 | 12/2018 | Do et al. | |

(Continued)

*Primary Examiner* — Mounir S Amer
*Assistant Examiner* — Alexander Belousov
(74) *Attorney, Agent, or Firm* — Myers Bigel, P.A.

(57) ABSTRACT

Semiconductor devices may include standard cells arranged in a first direction and a second direction intersecting the first direction. Both the first and second directions may be parallel to an upper surface of the substrate. Each of the standard cells may include semiconductor elements. The semiconductor device may also include filler cells between two standard cells, and each of the filler cells may include a filler active region and a filler contact connected to the filler active region and may extend in the first direction. The semiconductor device may further include a lower wiring pattern electrically connected to at least one of the semiconductor elements and may extend into at least one of the filler cells in the second direction, and the filler contacts may include wiring filler contacts lower than the lower wiring pattern and connected to at least one of the lower wiring pattern.

20 Claims, 25 Drawing Sheets

(56) References Cited

U.S. PATENT DOCUMENTS

| | | | |
|---|---|---|---|
| 2019/0155984 A1 | 5/2019 | Chen et al. | |
| 2019/0252380 A1 | 8/2019 | Sharma et al. | |
| 2019/0348527 A1* | 11/2019 | Liaw | H01L 21/823412 |
| 2020/0058634 A1* | 2/2020 | Chang | H01L 27/1052 |
| 2020/0091320 A1* | 3/2020 | Liaw | H01L 21/823437 |
| 2020/0395354 A1* | 12/2020 | Lee | G06F 30/394 |
| 2021/0057023 A1* | 2/2021 | Liaw | H01L 29/78696 |
| 2021/0174001 A1* | 6/2021 | Kim | G06F 30/392 |
| 2021/0313320 A1* | 10/2021 | Liaw | H01L 29/6681 |
| 2021/0366536 A1* | 11/2021 | Liaw | H01L 27/0207 |
| 2021/0384186 A1* | 12/2021 | Kim | G06F 30/39 |
| 2022/0005800 A1* | 1/2022 | Lee | H01L 27/0207 |
| 2022/0058326 A1* | 2/2022 | Lee | G06F 30/392 |

\* cited by examiner

IV - IV'

SEMICONDUCTOR DEVICES AND METHODS OF MANUFACTURING THE SAME

CROSS-REFERENCE TO RELATED APPLICATION(S)

This application claims priority under 35 U.S.C. § 119 to Korean Patent Application No. 10-2020-0007272 filed on Jan. 20, 2020, and Korean Patent Application No. 10-2019-0122523 filed on Oct. 2, 2019, in the Korean Intellectual Property Office, the disclosures of all of which are incorporated herein by reference in their entireties.

BACKGROUND

The present inventive concept relate to a semiconductor device and a method of manufacturing the same.

A semiconductor device may include semiconductor elements disposed on a semiconductor substrate and wirings for connecting the semiconductor elements to each other. As integration density of a semiconductor device has increased, researches to reduce a size of those wirings has been actively conducted.

SUMMARY

Some embodiments of the present inventive concept provide semiconductor devices in which wirings for connecting semiconductor elements included in standard cells are placed in filler cell regions between the standard cells.

According to some embodiments of the present inventive concept, semiconductor devices may include standard cells arranged in a first direction and a second direction on a substrate. Both the first direction and the second direction may be parallel to an upper surface of the substrate, and the second direction may be intersecting the first direction. Each of the standard cells may include semiconductor elements and a lower wiring pattern that may be electrically connected to at least one of the semiconductor elements and may extend in the second direction. The semiconductor devices may also include filler cells on the substrate. Each of the filler cells may be between two standard cells of the standard cells adjacent to each other in the second direction and may include a filler active region and a filler contact that may be connected to the filler active region and may extend in the first direction. The filler cells may include a first filler cell between a first standard cell and a second standard cell of the standard cells adjacent to each other in the second direction, and the lower wiring pattern of the first standard cell may extend into the first filler cell and may be connected to the filler contact of the first filler cell, and the filler contact of the first filler cell may be between the substrate and the lower wiring pattern of the first standard cell.

According to some embodiments of the present inventive concept, semiconductor device may include a standard cell region and a filler cell region adjacent to each other in one direction that may be parallel to an upper surface of a substrate; at least one semiconductor element in the standard cell region; at least one dummy element in the filler cell region; lower wiring patterns above the at least one semiconductor element and extending in the one direction; and a via structure that may be in contact with at least one lower wiring pattern of the lower wiring patterns and may be in contact with a filler contact. The filler contact may be in contact with an active region of the dummy element in the filler cell region and may extend in a different direction that may be intersecting the one direction. The at least one lower wiring pattern may continuously extend from the standard cell region into the filler cell region in the one direction.

According to some embodiments of the present inventive concept, semiconductor devices may include standard cells on a substrate; and filler cells. Each of the filler cells may be between two standard cells of the standard cells, and each of the filler cells may include filler active regions and filler contacts connected to the filler active regions and extending in a first direction that may be parallel to an upper surface of the substrate. At least one of the filler cells includes a first filler contact and a second filler contact of the filler contacts, wherein the second filler contact is spaced apart from the first filler contact in a second direction intersecting the first direction, and the first filler contact and the second filler contact have different lengths.

According to some embodiments of the present inventive concept, methods of manufacturing a semiconductor device may include forming active regions on a substrate including a standard cell region that includes a standard cell and a fill cell region that includes a filler cell; forming gate lines intersecting the active regions and extending in a first direction that may be parallel to an upper surface of the substrate; forming filler contacts including comprises at least one wiring filler contact that may be connected to at least one of the active regions in the filler cell region and may extend in the first direction; forming a via structure in contact with the at least one wiring filler contact among the filler contacts; and forming a lower wiring pattern in contact with an upper surface of the via structure and extending into the standard cell region in a second direction intersecting the first direction.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments of the present inventive concept will be described with reference to the accompanying drawings.

Figure 1:
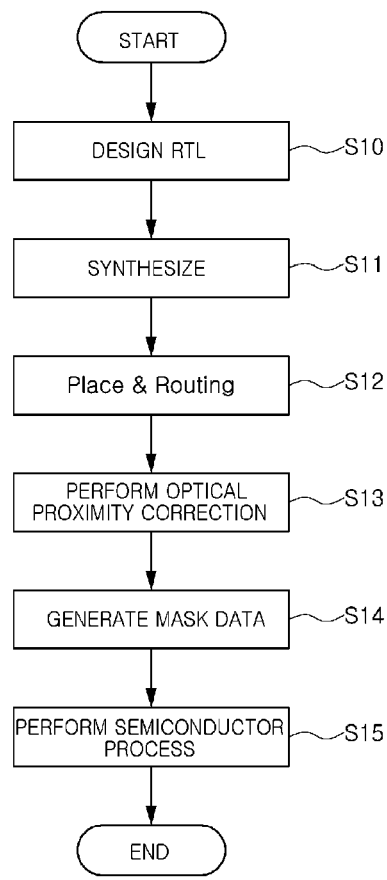
FIG. 1 is a flowchart illustrating a method of manufacturing a semiconductor device according to some embodiments of the present inventive concept.

FIG. 1 is a flowchart illustrating a method of manufacturing a semiconductor device according to example embodiments of the present inventive concept.

Referring to FIG. 1, a method of manufacturing a semiconductor device may start with designing a register transfer level (RTL) (S10). An RTL code generated by the designing the RTL may define a function of a semiconductor device. As an example, the RTL code may be represented by a language such as a VHSIC hardware description language (VHDL), Verilog, or the like.

Once an RTL code is generated, a logic synthesizing process for generating net list data of a semiconductor device from the RTL code may be performed using standard cells stored in a library (S11). The net list data may include standard cells and data for defining connection relationship between standard cells, and may be generated by a semiconductor designing tool.

A placing and routing process for generating layout data with reference to the net list data may be performed (S12). The placing and routing process in operation S12 may be performed with reference to a layout of the standard cells stored in a library. The semiconductor designing tool for performing the placing and routing process may generate layout data including information on placement of the standard cells and routing information for connecting the placed standard cells with reference to the library in which the standard cells are stored and the net list data.

Once the placing and routing process is completed, an optical proximity correction may be performed to the layout data generated in operation S12 (S13). Once the optical proximity correction is completed, mask data for forming various patterns on a plurality of layers may be generated (S14). Exposure may be performed on a photoresist, or the like, using the mask data, and after generating the mask data, a semiconductor process using a mask may be performed (S15) to manufacture a semiconductor device.

Empty regions may be formed between at least a portion of the standard cells placed in the placing and routing process. The empty regions may be filler cell regions that may include (e.g., may be filled with) filler cells. Differently from the standard cells including semiconductor elements (e.g., a gate electrode, and a source/drain region) substantially operating, a unit circuit implemented by semiconductor elements, and the like, the filler cell regions may be dummy regions. Wiring patterns for connecting at least a portion of the semiconductor elements included in adjacent standard cells may be formed in the filler cell regions, respectively. As used herein, the term "connect" may mean "electrically connect" and/or "physically connect." Each of semiconductor elements of a standard cell may be electrically connected to or coupled to at least one of elements of a semiconductor device and may perform a function during an operation of the semiconductor device. In contrast, a filler cell region of a semiconductor device may include elements (i.e., dummy elements) that may not be electrically connected to or coupled to any element and may not perform a function during an operation of the semiconductor device. For example, a standard cell includes an active region that is electrically coupled to a gate and functions as a channel region during an operation, and a filler cell includes a dummy active region that may have a structure the same as or similar to the active region of the standard cell but is not electrically coupled to a gate and does not function as channel region during an operation.

Wiring patterns for connecting semiconductor elements of standard cells may only be disposed on the semiconductor elements. In some embodiments, filler contacts in contact with a filler active region in the filler cell regions may be used as wiring patterns for electrically connecting the semiconductor elements included in the standard cells to each other. For example, at least a portion of lower wiring patterns disposed above the semiconductor elements in the standard cells and extending from the standard cells to the filler cells may be electrically connected to each other by the filler contacts included in the filler cells. Accordingly, the space for connecting the wiring patterns of the standard cells to each other may be secured upwardly and also downwardly of the wiring patterns such that integration density of the semiconductor device may improve. Also, the wiring patterns may be connected to each other in an efficient manner such that electrical properties of the semiconductor device may improve.

Figure 2:
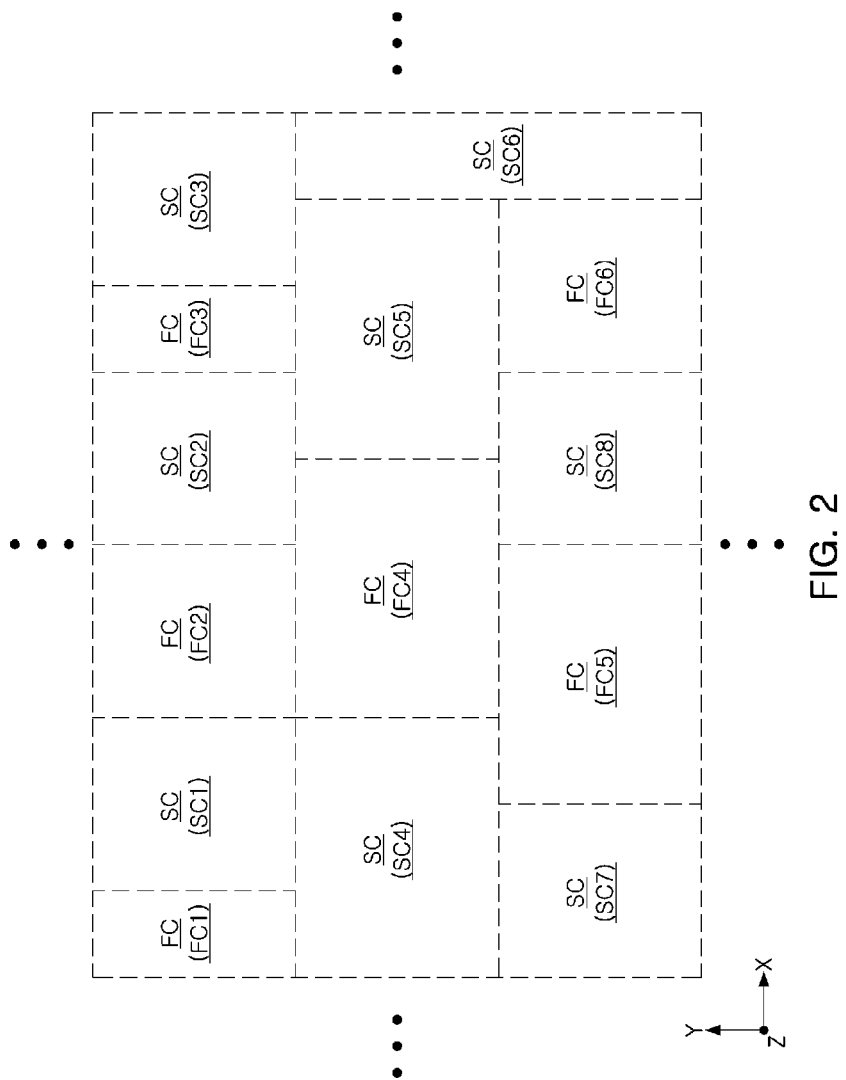
FIGS. 2 and 3 are plan diagrams illustrating a semiconductor device according to some embodiments of the present inventive concept.
Figure 3:
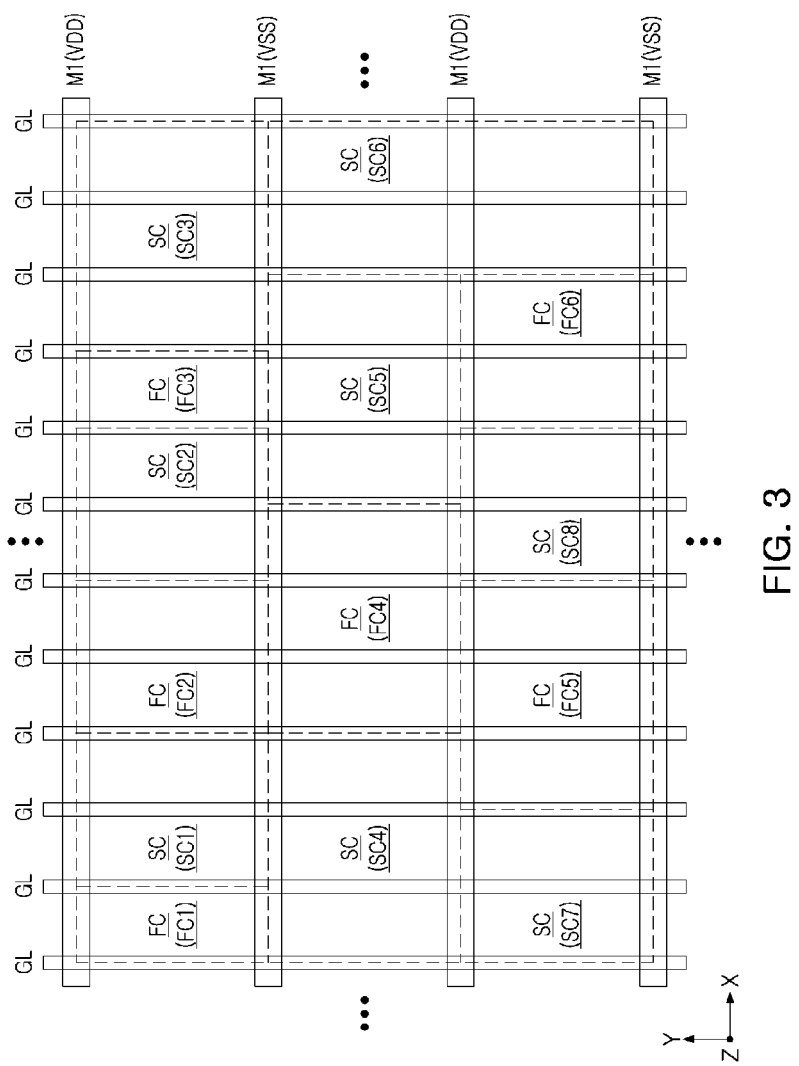

FIGS. 2 and 3 are plan diagrams illustrating a semiconductor device according to some embodiments of the present inventive concept.

FIG. 2 is a plan diagram illustrating a semiconductor device according to some embodiments, and FIG. 3 is a plan diagram of the semiconductor device shown in FIG. 2 showing power wiring patterns M1(VDD) and M1(VSS) and gate patterns GL.

Referring to FIGS. 2 and 3, a semiconductor device may include standard cell regions SC and filler cell regions FC. Standard cells may be disposed in the standard cell region SC such that semiconductor elements or/and circuits which substantially operate may be implemented, and filler cells may be disposed in the filler cell regions FC.

Although FIGS. 2 and 3 show that first to sixth standard cells SC1 to SC6 are disposed in the standard cell regions SC, the present inventive concept is not limited thereto. Various other standard cells may be disposed in the standard cell regions SC. Similarly, although FIGS. 2 and 3 show that the first to sixth filler cells FC1 to FC6 are disposed in the filler cell regions FC, the present inventive concept is not limited thereto. Various other filler cells may be disposed in the filler cell regions FC.

The semiconductor device may include the power wiring patterns M1(VDD) and M1(VSS) arranged in a first direction (Y axis direction). In some embodiments, the power wiring patterns M1(VDD) and M1(VSS) may be spaced apart from each other in the Y axis direction as illustrated in FIG. 3. The power wiring patterns M1(VDD) and M1(VSS) may extend in a second direction (X axis direction) intersecting the first direction. In some embodiments, each of the power wiring patterns M1(VDD) and M1(VSS) may extend longitudinally in the X axis direction as illustrated in FIG. 3. As an example, the power wiring patterns M1(VDD) and M1(VSS) may extend along a boundary between the standard cell regions SC and the filler cell regions FC. In some embodiments, at least one of the power wiring patterns M1(VDD) and M1(VSS) may cross at least one of the standard cell regions SC and the filler cell regions FC.

The gate patterns GL may extend in the first direction, and may be separated from each other in the second direction. In some embodiments, the gate patterns may extend longitudinally in Y axis direction and may be spaced apart from each other in the X axis direction as illustrated in FIG. 3. The gate patterns GL may include gate electrodes and dummy gate electrodes which provide semiconductor elements. For example, the dummy gate electrodes may be disposed on boundaries between the standard cell regions SC and the filler cell regions FC.

Figure 4:
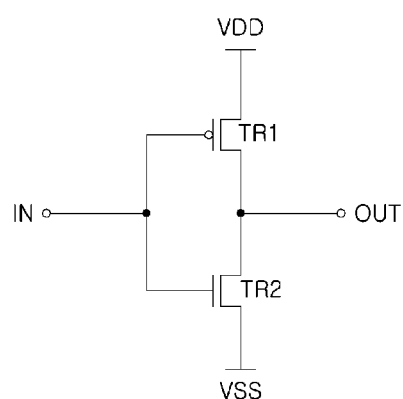
FIG. 4 is a circuit diagram illustrating an example of a unit circuit provided by a standard cell included in a semiconductor device according to some embodiments of the present inventive concept.
Figure 5:
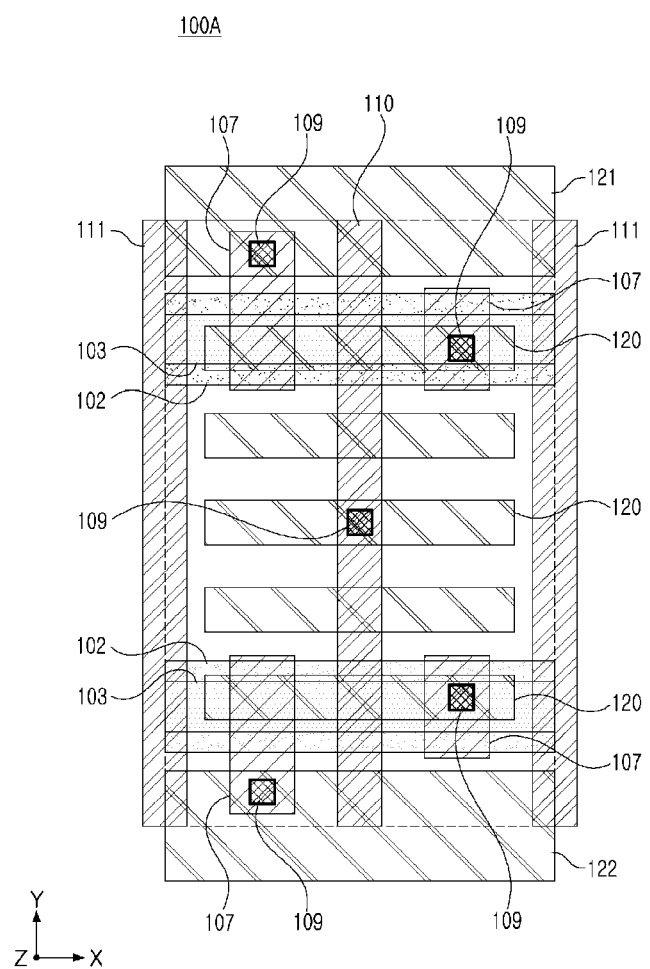
FIGS. 5 and 6 are plan diagrams illustrating standard cells corresponding to the unit circuit illustrated in FIG. 4.
Figure 6:
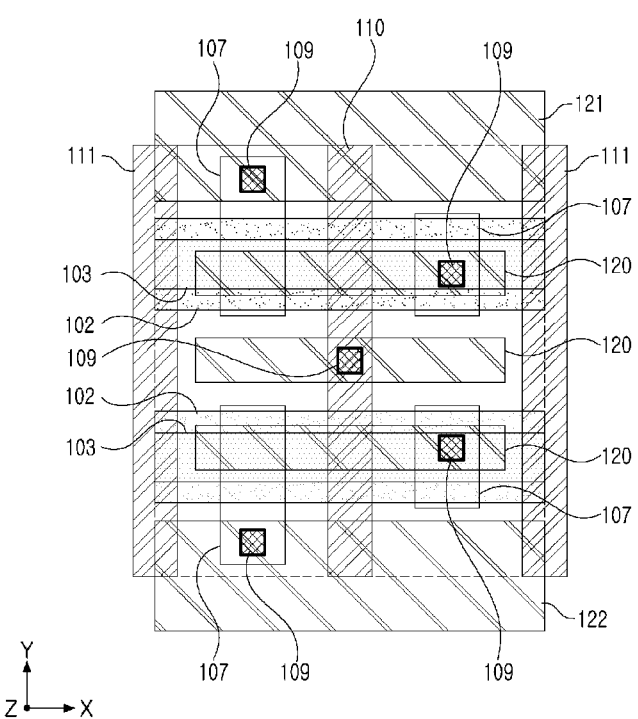

FIG. 4 is a circuit diagram illustrating an example of a unit circuit provided by a standard cell included in a semiconductor device according to some embodiments of the present inventive concept. FIGS. 5 and 6 are plan diagrams illustrating standard cells corresponding to the unit circuit illustrated in FIG. 4 according to some embodiments of the present inventive concept.

Referring to FIG. 4, the unit circuit may be configured as an inverter circuit. The inverter circuit may include a pull-up element TR1 receiving first power VDD and a pull-down element TR2 receiving second power VSS, and gates of the pull-up element TR1 and the pull-down element TR2 may be connected to each other and may provide an input terminal IN. One of source/drain regions of the pull-up element TR1 and one of source/drain regions of the pull-down element TR2 may be connected to each other and may provide an output terminal OUT. The inverter circuit may be one example of unit circuits provided by a standard cell. The standard cells may provide other various circuits different from the inverter circuit.

FIGS. 5 and 6 are plan diagrams illustrating standard cells providing an inverter circuit. Referring to FIG. 5, a standard cell 100A may include a pair of base regions 102 separated from each other in the first direction (Y axis direction), a pair of active regions 103 defined in the base regions 102 and extending in the second direction (X axis direction), and gate lines 110 and 111 extending in the first direction. The gate lines 110 and 111 may include a gate electrode 110 and a dummy gate electrode 111, and the gate electrode 110 may intersect the active regions 103. As used herein, "an element A extending in a direction B" (or similar language) may mean that the element A extending longitudinally in the direction B. The dummy gate electrode 111 may not function as a gate electrode during an operation.

The gate electrode 110 may provide a pull-up element TR1 and a pull-down element TR2 of an inverter circuit along with the active region 103. Referring to FIG. 4, in the inverter circuit, as gates of the pull-up element TR1 and the pull-down element TR2 are connected to each other, the gate electrode 110 may be shared by the pair of active regions 103. The gate electrode 110 may be connected to one of wiring patterns 120 through a lower via 109. The wiring patterns 120 may be wirings disposed on the active regions 103 and the gate lines 110 and 111, and may extend in the second direction.

The active regions 103 may be connected to active contacts 107. For example, the active contacts 107 may be disposed between the gate lines 110 and 111, and may extend in the first direction. To provide the inverter circuit, the active contact 107 connected to a first active region of the pair of active regions 103 may be connected to a first power wiring pattern 121 through the lower via 109, and the active contact 107 connected to a second active region of the pair of active regions 103 may be connected to a second power wiring pattern 122 through the lower via 109. The first power wiring pattern 121 may supply a first power voltage VDD, and the second power wiring pattern 122 may provide a second power voltage VSS. In some embodiments, the first power wiring pattern 121 and the second power wiring pattern 122 may be disposed on the same level, and may extend in the second direction.

A standard cell 100B illustrated in FIG. 6 may have an area smaller than an area of a standard cell 100A illustrated in FIG. 5. Referring to FIGS. 5 and 6, a height of the standard cell 100B may be less than a height of the standard cell 100A in the first direction. Thus, the number of the wiring patterns 120 included in the standard cell 100B may be smaller than the number of the wiring patterns 120 included in the standard cell 100A.

Recently, as integration density of a semiconductor device has increased, an area of each of the standard cells 100A and 100B has been reduced, and accordingly, heights of the standard cells 100A and 100B may decrease. As illustrated in FIG. 6, the standard cell 100B having a reduced height may include the lower number of wiring patterns 120 included in the standard cell 100B. To address the increase of integration density, the number of the wiring patterns 120 may be increased by decreasing a width of each of the wiring patterns 120 or/and a gap between the wiring patterns 120, but in this case, there may be an issue associated with increased resistance of the wiring patterns 120 or/and increased parasitic capacitance between the wiring patterns 120.

In some embodiments, at least a portion of the wiring patterns 120 of the standard cells 100A and 100B may be connected to each other using the filler contacts included in filler cells placed in the filler cell regions. The filler contacts may be connected to the filler cell region included in the filler cells, and may be disposed on a level lower than a level of the wiring patterns 120. Accordingly, a space for connecting the wiring patterns 120 may be additionally secured without changing a layout of the standard cells 100A and 100B, and integration density of the semiconductor device may improve (e.g., increase). Also, a width of the wiring patterns 120 may be maintained as is, or a width of the wiring patterns 120 may not be significantly decreased such that deterioration of resistive properties may be reduced, and electrical properties of the semiconductor device may improve. As a width of the wiring patterns 120 may not be significantly decreased, an increase of parasitic capacitance may be limited. Also, by using the filler contacts formed in the filler cell regions to connect the wiring patterns 120, electrical properties of the semiconductor device may improve. As used herein, "an element A on a level lower than a level of an element B" (or similar language) may mean that the element A is closer to a substrate than the element B. For example, each the elements A and B includes a surface facing the substrate, and the surface of the element A is closer to the substrate than the surface of the element B.

Figure 7:
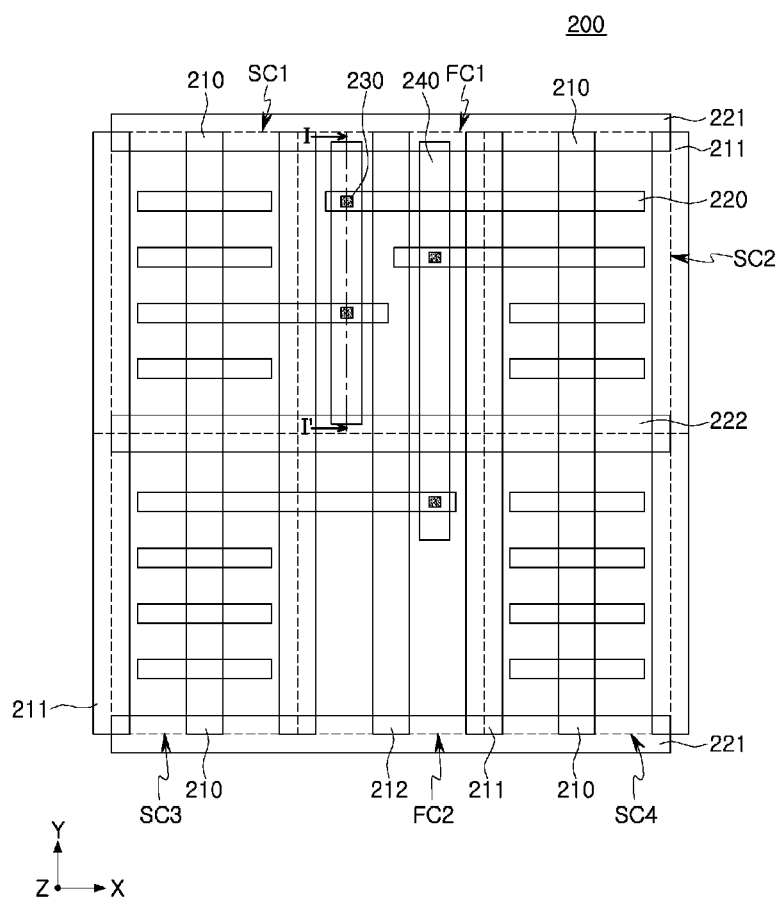
FIGS. 7 and 8 are diagrams illustrating a comparative example of a semiconductor device.
Figure 8:
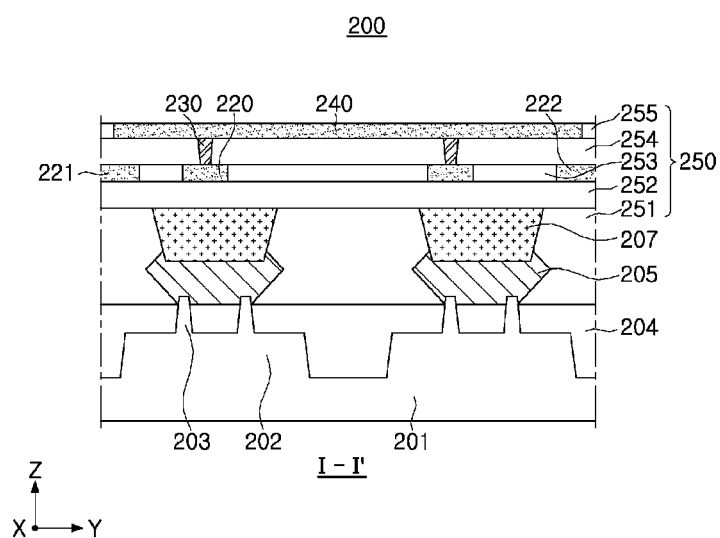

FIGS. 7 and 8 are diagrams illustrating a comparative example of a semiconductor device according to some embodiments.

Referring to FIG. 7, a semiconductor device 200 in the comparative example may include standard cells SC1 to SC4 and filler cells FC1 and FC2. The standard cells SC1 to SC4 may be disposed in the first direction (Y axis direction) and the second direction (X axis direction), and gate lines 210, 211, and 212 may be disposed with a certain gap. Also, power wiring patterns 221 and 222 may be disposed on boundaries among the standard cells SC1 to SC4. The standard cells SC1 to SC4 may be disposed in standard cell regions, and the filler cells FC1 and FC2 may be disposed in the filler cell regions.

Wiring patterns (e.g., lower wiring patterns 220) included in the standard cells SC1 to SC4 may be electrically connected to each other by wiring patterns (e.g., upper wiring patterns 240) disposed in the filler cell regions. In other words, lower wiring patterns 220 extending in the second direction (X axis direction) may be disposed in the standard cell regions, and upper wiring patterns 240 extending in the first direction (Y axis direction) may be disposed in the filler cell regions. The upper wiring patterns 240 may be disposed on the lower wiring patterns 220 in a third direction (Z axis direction), and may be connected to the lower wiring patterns 220 through upper vias 230.

Referring to FIG. 8, a cross-sectional diagram taken along the line I-I' in FIG. 7, the semiconductor device 200 may include a substrate 201, base regions 202 formed on the substrate 201, active regions 203 formed on the base regions 202, and a substrate insulating layer 204 surrounding the active regions 203. The active regions 203 may be defined as filler active regions included in the filler cells. The active regions 203 may include fin structures, and source/drain regions 205 may be connected to the active regions 203. Active contacts 207 extending in the first direction may be connected to the source/drain regions 205.

The wiring patterns 220, the upper vias 230, and the upper wiring patterns 240 may be disposed on the source/drain regions 205. The upper vias 230 may connect the lower wiring patterns 220 to the upper wiring patterns 240. The source/drain regions 205, the wiring patterns 220, the upper vias 230, and the upper wiring patterns 240 may be in interlayer insulating layers 251 to 255 (250).

In the comparative example, in a routing process for connecting the lower wiring patterns 220 connected to semiconductor elements of the standard cells SC1 to SC4 to each other, the upper wiring patterns 240 may be formed in the filler cell regions in which the filler cells FC1 and FC2 are disposed. In accordance with an increase of integration density of the semiconductor device 200 and a decrease of areas of the standard cells SC1 to SC4 according to the increase of integration density, the number of the lower wiring patterns 220 included in the standard cells SC1 to SC4, respectively, may decrease. Thus, it may be necessary to secure other resources usable to the process of routing the standard cells SC1 to SC4 in addition to the upper wiring patterns 240 disposed in the filler cell regions, as illustrated in the diagram.

According to some embodiments of the present inventive concept, the active contacts formed in the filler cell regions may be used in the routing of the standard cells SC1 to SC4. For example, the active contacts (e.g., 307 in FIGS. 11 and 12) in the filler cell regions may be formed on a level the same as a level of the active contacts (e.g., 307 in FIG. 13) of the standard cells SC1 to SC4. To route the standard cells SC1 to SC4, the active contacts in the filler cell regions may have a length different from a length of each of the active contacts of the standard cells SC1 to SC4 in the first direction. In some embodiments, at least a portion of the lower wiring patterns (e.g., 320 in FIG. 10) of the standard cells SC1 to SC4 may be connected to each other using the active contacts formed in advance with a length the same as a length of each of the filler cells FC1 and FC2 in the first direction.

Consequently, by using the active contacts disposed on a level lower than a level of the lower wiring patterns 220 in the filler cell regions, and the upper wiring patterns 240 disposed on a level higher than a level of the lower wiring patterns 220 to the routing of the standard cells SC1 to SC4, resources required for the routing may be secured. Thus, integration density of the semiconductor device 200 may improve, and electrical properties may improve by securing a routing path efficiently, performance of the semiconductor device 200 may improve.

Figure 9:
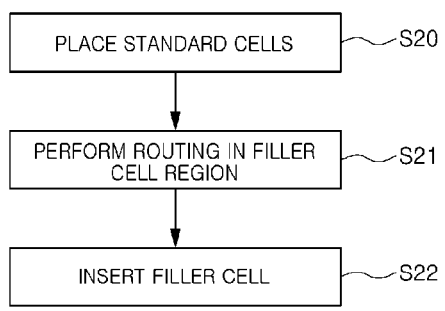
FIG. 9 is a flowchart illustrating a method of designing a layout of a semiconductor device according to some embodiments of the present inventive concept.

FIG. 9 is a flowchart illustrating a method of designing a layout of a semiconductor device according to some embodiments of the present inventive concept.

Referring to FIG. 9, a method of designing a layout of a semiconductor device may start with placing standard cells (S20). The standard cells may be pre-stored in a library, and may provide a unit circuit for manufacturing the semiconductor device.

Once the standard cells are placed, a routing process may be performed in a filler cell region defined between the standard cells (S21). In some embodiments, while the routing process of operation S21 is performed, wirings extending in a direction the same as a direction in which gate lines extend in the filler cell region may be formed. For example, the wirings may be active contacts placed in the filler cell regions. In some embodiments, at least a portion of the active contacts disposed in the filler cell regions may be designed differently and may be used in the routing.

Once the routing process in operation S21 is completed, the filler cell may be inserted into the filler cell region (S22). The filler cell inserted in operation S21 may include active contacts designed in advance in the filler cell regions in operation S21. In some embodiments, the filler cell inserted in operation S22 may include a gate line, source/drain regions, active contacts, and others, and the active contacts of the filler cell may be determined in accordance with a design determined in operation S21.

Once the insertion of the filler cell is completed, a routing process for the remaining standard cells may be performed. Once the routing process is terminated, layout data may be provided as data of a graphic design system (GDS) type or a GDS II type. Once the layout data is generated, a process of a design rule check (DRC) for the layout data or/and a process of a layout versus schematic (LVS) for verifying whether the layout data matches an initially intended design circuit may be performed. When the layout data is confirmed by the above-described process, an optical proximity correction for the layout data may be performed to generate mask design data, a mask may be generated in accordance with the mask design data, and a semiconductor process may be performed on a semiconductor substrate.

FIGS. 10 to 13 are diagrams illustrating a semiconductor device according to some embodiments.

Figure 10:
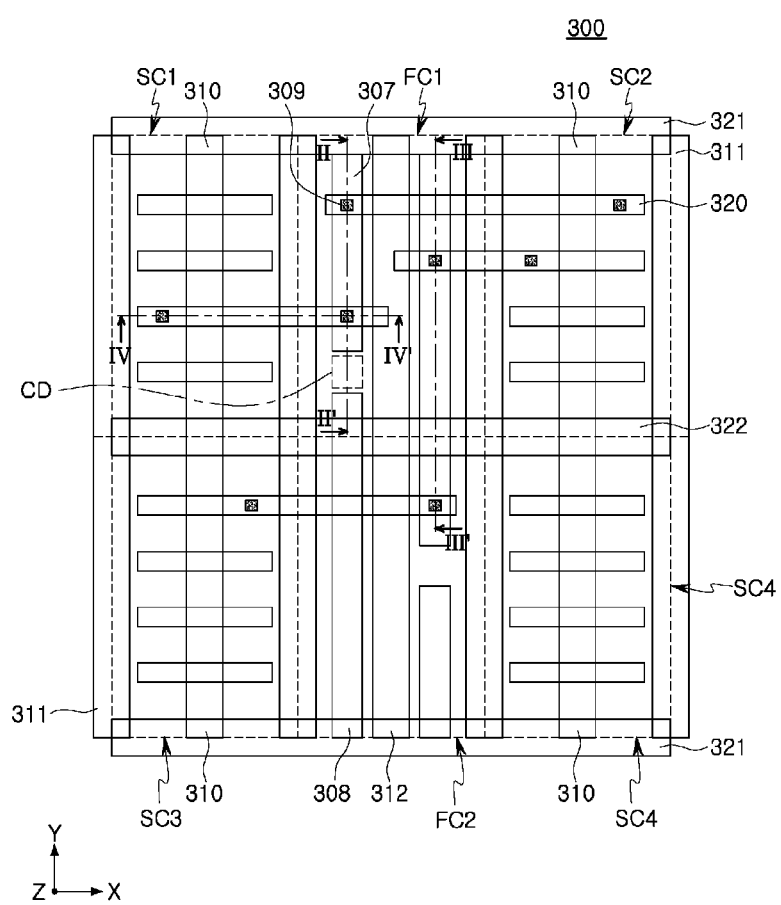
FIGS. 10 to 13 are diagrams illustrating a semiconductor device according to some embodiments of the present inventive concept.

Referring to FIG. 10, a semiconductor device 300 may include standard cells SC1 to SC4 and filler cells FC1 and FC2 disposed in filler cell regions among the standard cells SC1 to SC4. The standard cells SC1 to SC4 may be disposed in the first direction (Y axis direction) and the second direction (X axis direction), and gate lines 310, 311, and 312 may be disposed with a certain gap therebetween. The gate lines 310 to 312 may extend in the first direction and may be separated from each other in the second direction. In some embodiments, the gate lines 310, 311, and 312 may be spaced apart from each other in the second direction by a predetermined distance as illustrated in FIG. 10. The gate lines 310 to 312 may include gate electrodes 310 disposed in the standard cells SC1 to SC4, dummy gate electrodes 311 extending along boundaries of the standard cells SC1 to SC4, and filler gate electrodes 312 disposed in the filler cells FC1 and FC2.

Power wiring patterns 321 and 322 may be disposed on boundaries of the standard cells SC1 to SC4. The power wiring patterns 321 and 322 may extend in the second direction and may be separated from each other in the first direction. In some embodiments, the power wiring patterns 321 and 322 may be spaced apart from each other in the first direction.

The standard cells SC1 to SC4 may include lower wiring patterns 320 extending in the second direction. The number of the lower wiring patterns 320 included in the standard cells SC1 to SC4, respectively, may vary. In some embodiments, the lower wiring patterns 320 may be disposed on a level the same as a level of the power wiring patterns 321 and 322, but the present inventive concept is not limited thereto. In some embodiments, the lower wiring patterns 320 and the power wiring patterns 321 and 322 may be disposed on different levels.

In some embodiments, at least a portion of the lower wiring patterns 320 included in the standard cells SC1 to SC4 may be electrically connected to each other by at least one of filler contacts 307 and 308 included in the filler cells FC1 and FC2. The filler contacts 307 and 308 may include wiring filler contacts 307 used in a routing process for connecting at least a portion of the lower wiring patterns 320 to each other, and dummy filler contacts 308 which are not used in the routing process. In some embodiments, the wiring filler contacts 307 may be connected to the lower wiring patterns 320 by lower vias 309 extending in the third direction (Z axis direction). In some embodiments, no lower via 309 may be connected to the dummy filler contacts 308, and each of the dummy filler contacts 308 may not be electrically connected to any element of the standard cells SC1 to SC4.

The filler contacts 307 and 308 included in the filler cell regions may be designed based on positions of the lower wiring patterns 320 connected to the wiring filler contacts 307. For example, a position and a length of each of the wiring filler contacts 307 may be determined in accordance with positions of the lower wiring patterns 320 connected to the wiring filler contacts 307. The dummy filler contacts 308 may be disposed in a region in which the wiring filler contacts 307 are not disposed.

In some embodiments, at least one of the filler cells FC1 and FC2 may include a first filler contact and a second filler contact disposed on both sides of the filler gate electrode 312. In some embodiments, at least one of the filler cells FC1 and FC2 may include the first and second filler contacts that are adjacent to opposing sides of the filler gate electrode 312, respectively. At least one of the first filler contact and the second filler contact may be provided to the wiring filler contact 307, and a position and a length of the wiring filler contact 307 may be varied depending on positions of the lower wiring patterns 320 connected by the wiring filler contact 307. Thus, in at least one of the filler cells FC1 and FC2, the first filler contact and the second filler contact may have different lengths.

In some embodiments illustrated in FIG. 10, the first filler cell FC1 may include the first filler contact 307 disposed on a left side of the filler gate electrode 312 and the second filler contact 307 disposed on a right side of the filler gate electrode 312. A length of the first filler contact 307 may be less than a length of the second filler contact 307 in the first direction, and the second filler contact 307 may cross filler cells FC1 and FC2 adjacent to each other in the first direction. Each of the first filler contact 307 and the second filler contact 307 may be provided as a routing region for connecting at least a portion of each of the semiconductor elements included in the standard cells SC1 to SC4 and disposed in different positions to each other.

Referring to FIG. 10, one of the wiring filler contacts 307 may connect the lower wiring patterns 320 included in a first standard cell SC1 and a second standard cell SC2 to each other. In other words, the semiconductor elements of two or more standard cells SC1 and SC2 disposed in the same position in the first direction and in different positions in the second direction may be electrically connected to each other by one of the wiring filler contacts 307. The other of the wiring filler contacts 307 may connect the lower wiring patterns 320 included in a second standard cell SC2 and a third standard cell SC3 to each other. In other words, the semiconductor elements of two or more standard cells SC2 and SC3 disposed in different positions in the first direction and the second direction may be electrically connected to each other by the other of the wiring filler contacts 307.

In accordance with a routing design, the wiring filler contacts 307 included in a first filler cell FC1 may have different lengths in the first direction. At least one of the wiring filler contacts 307 may cross a boundary between filler cell regions (e.g., FC1 and FC2 in FIG. 10) adjacent to each other in the first direction and may extend in the first direction. In other words, at least one of the wiring filler contacts 307 may extend further than at least one of the filler cell regions in the first direction. Also, the filler contacts 307 and 308 may not go beyond the filler cells FC1 and FC2 in the second direction. In other words, the filler contacts 307 and 308 may only be disposed in the filler cell regions in which the filler cells FC1 and FC2 are disposed, and may not extend to the standard cell regions in which the standard cells SC1 to SC4 are disposed.

In some embodiments, a design of the filler cells FC1 and FC2 stored in the library may not include the filler contacts 307 and 308 connected to the source/drain regions. In a routing process for placing the standard cells SC1 to SC4 and connecting the lower wiring patterns 320 to each other, a position and a length of each of the filler contacts 307 and 308 may be designed, and the filler cells FC1 and FC2 may be inserted into the filler cell regions. Accordingly, the design of the filler cells FC1 and FC2 may not include a definition of a position and a length of each of the active contacts.

At least a portion of the filler contacts 307 and 308 may be separated from each other in the first direction in one of the filler cells FC1 and FC2. Referring again to FIG. 10, the wiring filler contact 307 and the dummy filler contact 308 may be separated from each other in the first direction in the first filler cell FC1. Contact separation regions CD may be defined between the wiring filler contact 307 and the dummy filler contact 308. A width of each of the contact separation regions CD may be the same as or different from a width of each of the power wiring patterns 321 and 322 in the first direction. For example, a width of each of the contact separation regions CD in the first direction may be less than a width of each of the power wiring patterns 321 and 322 in the first direction.

Figure 11:
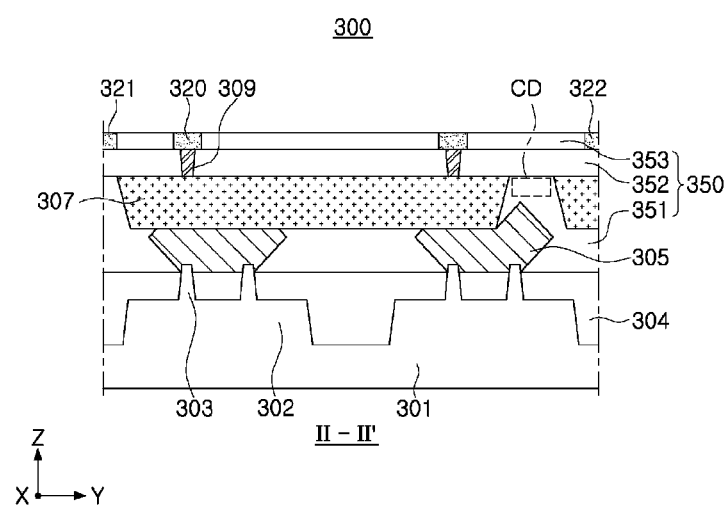

Referring to FIG. 11, a cross-sectional diagram taken along the line II-II' in FIG. 10, a semiconductor device 300 may include a substrate 301, base regions 302 formed on the substrate 301, active regions 303 formed on the base regions 302, and a substrate insulating layer 304 surrounding the active regions 303. The active regions 303 may be configured as filler active regions included in the filler cells, and may be fin structures. Each of the active regions 303 may have a fin shaped active region. Source/drain regions 305 may be connected to the active regions 303. Filler contacts 307 and 308 may be disposed on the source/drain regions 305.

Filler contacts 307 and 308 may include the wiring filler contact 307 and the dummy filler contact 308. The lower vias 309 and the lower wiring patterns 320 may be disposed on the wiring filler contact 307. The filler contacts 307 and 308, the lower vias 309, and the lower wiring patterns 320 may be covered by interlayer insulating layers 351, 352, and 353 (350). In some embodiments, the filler contacts 307 and 308, the lower vias 309, and the lower wiring patterns 320 may be in the interlayer insulating layers 351 to 353 (350). At least a portion of the lower wiring patterns 320 may be electrically connected to each other by the lower vias 309 and the wiring filler contact 307. According to embodiments illustrated in FIG. 11, the lower wiring patterns 320 included in the first standard cell SC1 and the second standard cell SC2 may be electrically connected to each other through the lower vias 309 and the wiring filler contact 307.

As illustrated in FIG. 11, at least a portion of the lower wiring patterns 320 may be connected to each other using the wiring filler contact 307 disposed in at least one of the filler cell regions in which the filler cells FC1 and FC2 are disposed. To connect the lower wiring patterns 320 to each other, at least one of the filler contacts 307 and 308 in the filler cell regions may extend further than the source/drain regions 305 in the first direction.

Figure 12:
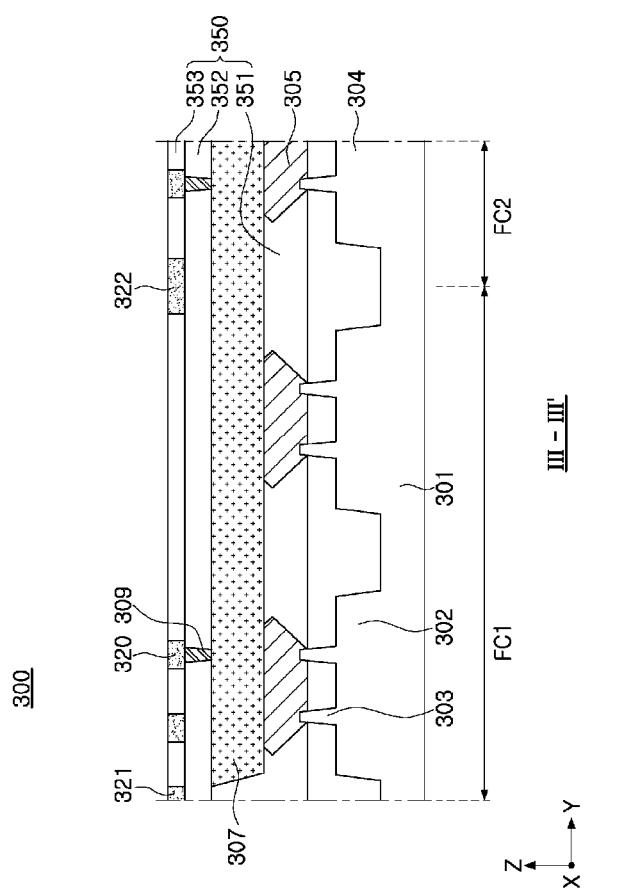

Referring to FIG. 12, a cross-sectional diagram taken along the line in FIG. 10, at least one wiring filler contact 307 may cross the first filler cell FC1 and the second filler cell FC2 and may extend in the first direction. Accordingly, a length of at least one wiring filler contact 307 may be greater than a length of the first filler cell FC1 in the first direction.

The wiring filler contact 307 may electrically connect the second standard cell SC2 adjacent to the first filler cell FC1 in the second direction to the third standard cell SC3 adjacent to the second filler cell FC2 in the second direction. By securing a routing region connecting the second standard cell SC2 and the third standard cell SC3 to each other on a level lower than a level of the lower wiring patterns 320, integration density of the semiconductor device 300 may improve. Also, by designing a routing path in an efficient manner, electrical properties of the semiconductor device 300 may also improve.

Figure 13:
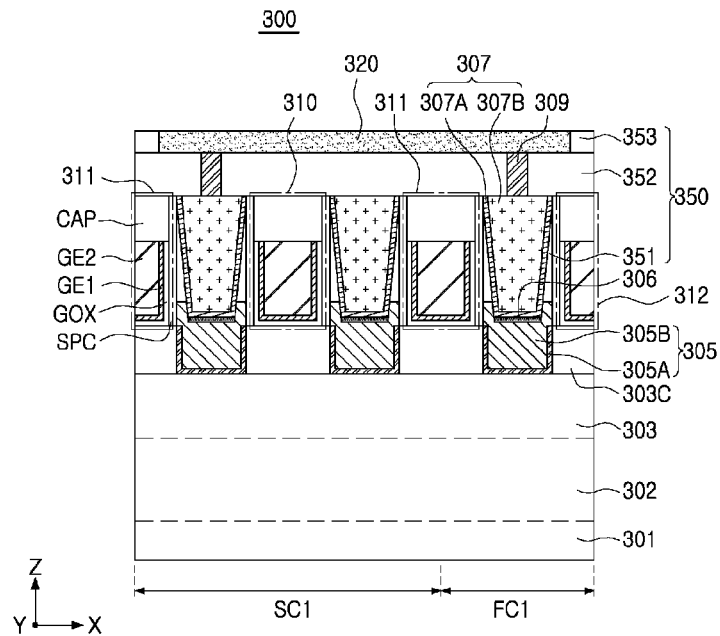

FIG. 13 is a cross-sectional diagram taken along the line IV-IV' in FIG. 10. Referring to FIG. 13, the semiconductor device 300 may include the substrate 301, the base regions 302, and the active regions 303. The active regions 303 may include filler active regions disposed in the first filler cell FC1 and element activation regions disposed in the first standard cell SC1. The active regions 303 may be connected to channel regions 303C in the third direction, and the channel regions 303C may be covered by the gate lines 310 to 312.

The channel regions 303C may be connected to the source/drain regions 305 in the second direction. The source/drain regions 305 may include a lower region 305A and an upper region 305B. The lower region 305A may be grown from the active regions 303, and the upper region 305B may be grown from the lower region 305A. The source/drain regions 305 may be doped with N-type impurities or P-type impurities depending on a type of the semiconductor element included in the semiconductor device 300.

The gate electrode 310 and the source/drain regions 305 may provide a semiconductor element between the dummy gate electrodes 311. Also, the filler gate electrode 312 may provide a dummy element along with source/drain regions 305 adjacent to each other in the second direction. Accordingly, the semiconductor elements may be disposed in the standard cells SC1 to SC4, and dummy elements may be disposed in the filler cells FC1 and FC2.

In the first filler cell FC1, a filler contact 307 may be connected to the source/drain region 305. In some embodiments, an intermediate conductive layer 306 formed of a metal silicide material, or the like, may be disposed between the filler contact 307 and the source/drain regions 305. The filler contact 307 may include a first contact layer 307A and a second contact layer 307B, and the first contact layer 307A and the second contact layer 307B may be formed of a conductive material. For example, the first contact layer 307A and the second contact layer 307B may be formed of different conductive materials.

The wiring filler contact 307 may be connected to a lower wiring pattern 320 through a lower via 309. The lower via 309 may be in contact with the filler contact 307 connected to the source/drain region 305 of the dummy element disposed in the first filler cell FC1 and extending in the first direction. The lower via 309 may be in contact with the lower wiring pattern 320 extending in the second direction. According to example embodiments illustrated in FIG. 13, the lower wiring pattern 320 may cross the first standard cell SC1 and the first filler cell FC1 in the second direction and may extend in the second direction, and may be connected to at least one of the semiconductor elements disposed in the first standard cell SC1, for example.

In FIG. 13, the lower wiring pattern 320 may be connected to one of the source/drain regions 305 of the semiconductor element disposed in the first standard cell SC1, but the present inventive concept is not limited thereto. For example, the lower wiring pattern 320 may be connected to at least one of the gate electrodes 310 included in the first standard cell SC1 or the other standard cells SC2 to SC4.

Each of the gate lines 310 to 312 may include a gate insulating layer GOX, a gate spacer SPC, a first gate electrode GE1, a second gate electrode GE2, and a capping layer CAP. The first gate electrode GE1 and the second gate electrode GE2 may be formed of conductive materials, and may be formed of different conductive materials, for example.

As described with reference to FIGS. 10 to 13, the lower wiring patterns 320 in the semiconductor device 300 may be electrically connected to each other by the wiring filler contact 307 disposed below the lower wiring patterns 320 in the filler cell regions. Although FIGS. 10 to 13 do not show, the lower wiring patterns 320 in the semiconductor device 300 may be electrically connected to each through upper wiring patterns (e.g., 240 in FIGS. 7 and 8) that are provided on the lower wiring patterns 320. Accordingly, a routing region for connecting the lower wiring patterns 320 included in the standard cells SC1 to SC4 may be secured on a level lower than a level of the lower wiring patterns 320 and also on a level higher than a level of the lower wiring patterns 320, and integration density and electrical properties of the semiconductor device 300 may improve.

Figure 14:
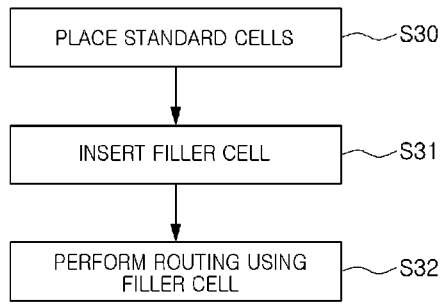
FIG. 14 is a flowchart illustrating a method of designing a layout of a semiconductor device according to some embodiments of the present inventive concept.

FIG. 14 is a flowchart illustrating a method of designing a layout of a semiconductor device according to some embodiments of the present inventive concept.

Referring to FIG. 14, a method of designing a semiconductor device may start with placing standard cells (S30). Similarly to the aforementioned example embodiments described with reference to FIG. 9, the standard cells may be stored in a library in advance, and may provide a unit circuit for manufacturing the semiconductor device.

Once the standard cells are placed, a filler cell may be inserted into a filler cell region defined between the standard cells (S31). The filler cell inserted in operation S31 may include a filler gate electrode, source/drain regions, and active contacts. As an example, the active contacts included in the filler cell may be disposed on both sides of the filler gate electrode. Also, the active contacts may extend in the filler cell.

Once the insertion of the filler cell is completed, a routing process may be performed using the active contacts of the filler cell (S32). The routing process in operation S32 may include a process of connecting the active contacts included in the filler cell to wiring patterns of adjacent standard cells adjacent to the filler cell. For example, the active contacts of the filler cell may be connected to the lower wiring patterns extending from the standard cells using lower vias. The lower vias may be in contact with an upper surface of each of the active contacts of the filler cell and a lower surface of each of the lower wiring patterns extending from the standard cells. When the routing process using the active contacts of the filler cell is terminated, the rest of the routing process may be performed and layout data may be generated.

Figure 15:
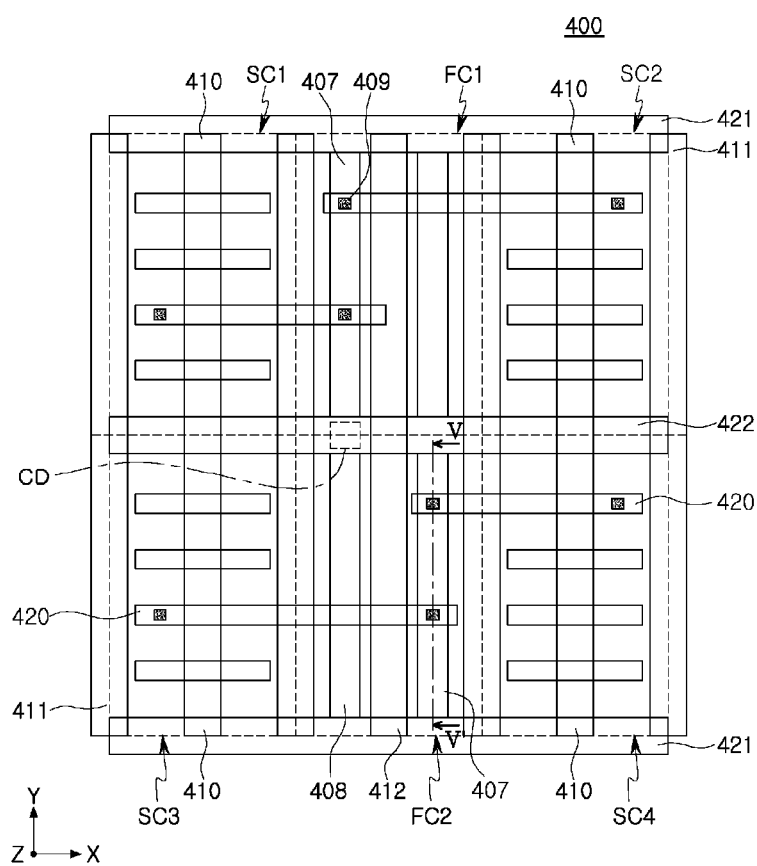
FIGS. 15 and 16 are diagrams illustrating a semiconductor device according to some embodiments of the present inventive concept.
Figure 16:
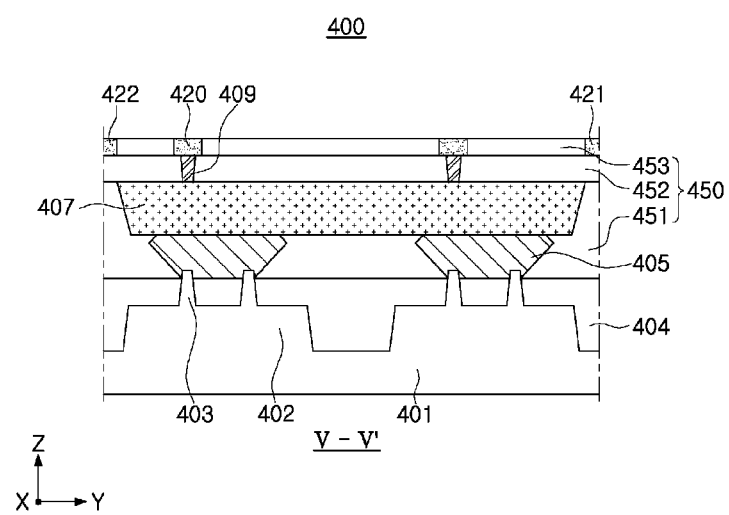

FIGS. 15 and 16 are diagrams illustrating a semiconductor device according to some embodiments.

Referring to FIG. 15, a semiconductor device 400 may include standard cells SC1 to SC4 and filler cells FC1 and FC2 disposed in filler cell regions among the standard cells SC1 to SC4. The standard cells SC1 to SC4 may be disposed in the first direction (Y axis direction) and the second direction (X axis direction), and gate lines 410, 411, and 412 may be disposed with a certain gap. The gate lines 410 to 412 may extend in the first direction and may be separated from each other in the second direction. The gate lines 410 to 412 may include gate electrodes 410 disposed in the standard cells SC1 to SC4, dummy gate electrodes 411 extending along boundaries of the standard cells SC1 to SC4, and filler gate electrodes 412 disposed in the filler cells FC1 and FC2. In some embodiments, the gate lines 410, 411, and 412 may extend longitudinally in the first direction and may be spaced apart from each other in the second direction by a predetermined distance as illustrated in FIG. 15.

Power wiring patterns 421 and 422 may be disposed on boundaries of the standard cells SC1 to SC4. The power wiring patterns 421 and 422 may extend in the second direction and may be separated from each other in the first direction. In some embodiments, the power wiring patterns 421 and 422 may extend longitudinally in the second direction and may be spaced apart from each other in the first direction by a predetermined distance as illustrated in FIG. 15.

The standard cells SC1 to SC4 may include lower wiring patterns 420 extending in the second direction. The number of the lower wiring patterns 420 included in the standard cells SC1 to SC4, respectively, may vary, and the present inventive concept is not limited to the number of the lower wiring patterns 420 illustrated in FIG. 15. In FIG. 15, the number of the lower wiring patterns 420 included in the standard cells SC1 to SC4, respectively, may be the same, but the number of the lower wiring patterns 420 included in at least a portion of the standard cells SC1 to SC4 may be different. In some embodiments, the lower wiring patterns 420 may be disposed on a level the same as a level of the power wiring patterns 421 and 422 in the third direction (Z axis direction). In some embodiments, the lower wiring patterns 420 and the power wiring patterns 421 and 422 may be disposed on different levels.

In some embodiments, at least a portion of the lower wiring patterns 420 included in the standard cells SC1 to SC4 may extend into the filler cell regions, and may be electrically connected to each other by at least one of filler contacts 407 and 408 included in the filler cells FC1 and FC2. The filler contacts 407 and 408 may include wiring filler contacts 407 and dummy filler contacts 408, and at least a portion of the lower wiring patterns 420 may be electrically connected to each other by the wiring filler contacts 407. The filler contacts 407 and 408 disposed in the same position in the second direction may be separated from each other in the first direction by contact separation regions CD disposed below the power wiring patterns 421 and 422.

The lower wiring patterns 420 may be connected to the wiring filler contacts 407 by lower vias 409 extending in the third direction, and the wiring filler contacts 407 may extend in the second direction. The wiring filler contacts 407 of the filler cells FC1 and FC2 may be provided as routing wirings for connecting the lower wiring patterns 420 on a level lower than a level of the lower wiring patterns 420.

Each of the filler contacts 407 and 408 of the filler cells FC1 and FC2 may have a shape in accordance with a predetermined design rule. According to example embodiments illustrated in FIG. 15, each of the filler contacts 407 and 408 may have a length which does not go beyond each of the filler cells FC1 and FC2 and may extend in the first direction. A length of each of the filler contacts 407 and 408 may be the same as or less than a length of each of the filler cells FC1 and FC2 in the first direction. The filler contacts 407 and 408 may not extend to the standard cells SC1 to SC4.

In some embodiments, a routing process using the filler contacts 407 and 408 of the filler cells FC1 and FC2 may include a process of designating a position of each of the lower vias 409. As illustrated in FIG. 15, by disposing the lower vias 409 in the first filler cell FC1, the first standard cell SC1 and a second standard cell SC2 may be electrically connected to each other. Also, by disposing the lower vias 409 in the second filler cell FC2 as illustrated in FIG. 15, the third standard cell SC3 and the fourth standard cell SC4 may be electrically connected to each other.

By disposing upper wiring patterns on the lower wiring patterns 420 for connecting the lower wiring patterns 420 and also disposing the lower vias 409 in the filler cells FC1 and FC2, respectively, the wiring filler contacts 407 of the filler cells FC1 and FC2 may be used as routing wirings for connecting the lower wiring patterns 420 to each other. Accordingly, a region for connecting the lower wiring patterns 420 may be secured upwardly and downwardly of the lower wiring patterns 420, integration density of the semiconductor device 400 may improve. Also, by connecting the lower wiring patterns 420 in an efficient manner using the wiring filler contacts 407, electrical properties and performance of the semiconductor device 400 may improve. According to some embodiments of the present inventive concept, multiple lower wiring patterns in standard cells (e.g., 420 in FIGS. 15 and 16) may be electrically connected to each other through a conductive element that is provided above or below these lower wiring patterns. Stated differently, according to some embodiments of the present inventive concept, both regions above and below lower wiring patterns may include conductive elements used for routing of these lower wiring patterns.

The dummy filler contacts 408 may not be connected to the lower vias 409, and accordingly, the dummy filler contacts 408 may be electrically isolated from the lower wiring patterns 420. According to example embodiments illustrated in FIG. 15, each of the filler cells FC1 and FC2 may include the wiring filler contact 407 and the dummy filler contact 408, but the present inventive concept is not limited thereto. For example, at least one of the filler cells FC1 and FC2 may only include the wiring filler contacts 407, and at least one of the filler cells FC1 and FC2 may only include the dummy filler contacts 408.

Referring to FIG. 16, a cross-sectional diagram taken long the line V-V' in FIG. 15, the semiconductor device 400 may include a substrate 401, base regions 402 formed on the substrate 401, active regions 403 formed on the base regions 402, and a substrate insulating layer 404 surrounding the active regions 403. The active regions 403 may be configured as filler active regions included in the filler cells. The active regions 403 may be connected to source/drain regions 405. Filler contacts 407 and 408 may be connected to the source/drain regions 405.

The filler contacts 407 and 408 may include the wiring filler contact 407 and the dummy filler contact 408, and in the cross-sectional diagram taken long line V-V' illustrated in FIG. 16, only the wiring filler contact 407 may be illustrated. The wiring filler contact 407 may extend in the first direction between the power wiring patterns 421 and 422. The wiring filler contact 407 may have a length which does not go beyond the power wiring patterns 421 and 422 in the first direction. In some embodiments, the wiring filler contact 407 may have a length in the first direction that is equal to a distance between the power wiring patterns 421 and 422 in the first direction as illustrated in FIG. 15 or is shorter than the distance between the power wiring patterns 421 and 422 in the first direction.

The lower vias 409 and the lower wiring patterns 420 may be disposed on the wiring filler contact 407, and the wiring filler contact 407, the lower vias 409, and the lower wiring patterns 420 may be covered by interlayer insulating layers 451 to 453 (450). At least a portion of the lower wiring patterns 420 may be electrically connected to each other by the lower vias 409 and the wiring filler contacts 407.

Figure 17:
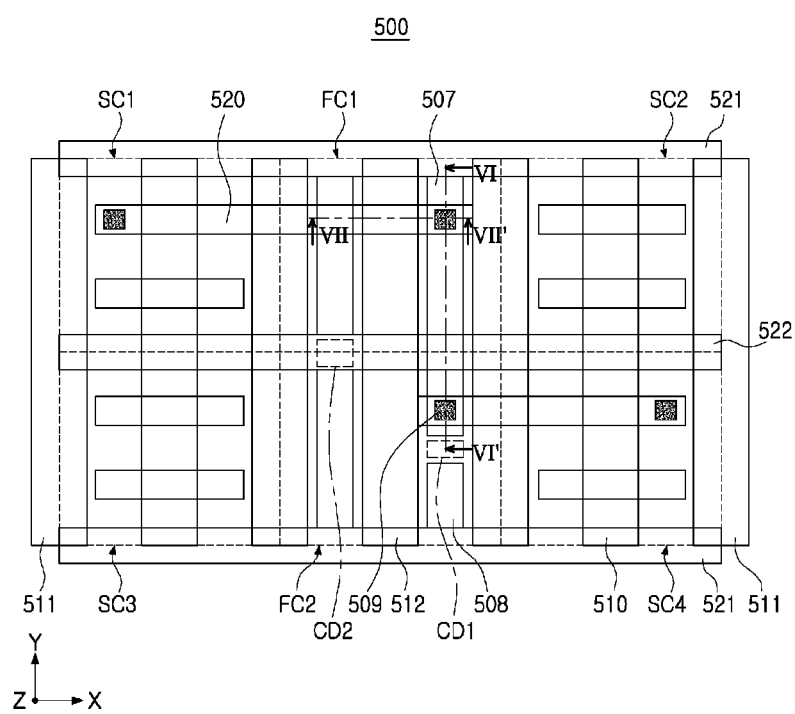
FIGS. 17 to 19 are diagrams illustrating a semiconductor device according to some embodiments of the present inventive concept.
Figure 18:
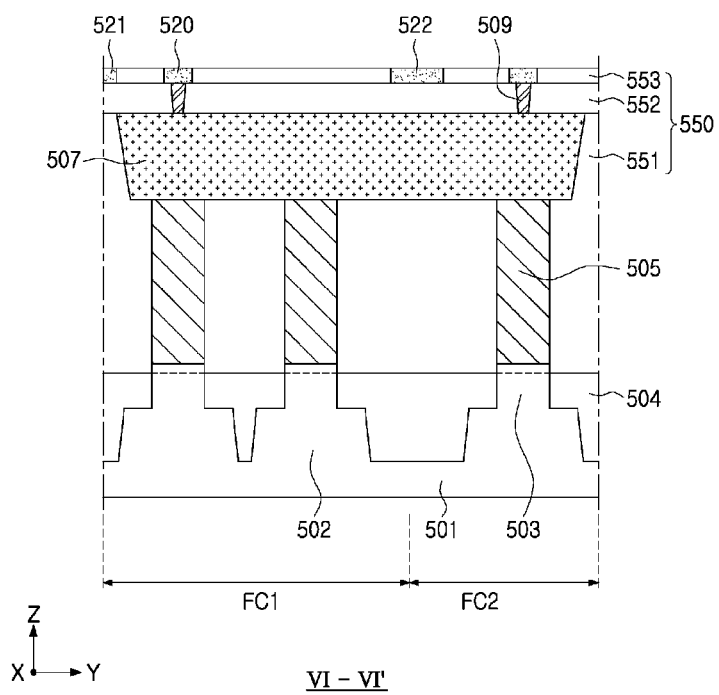
Figure 19:
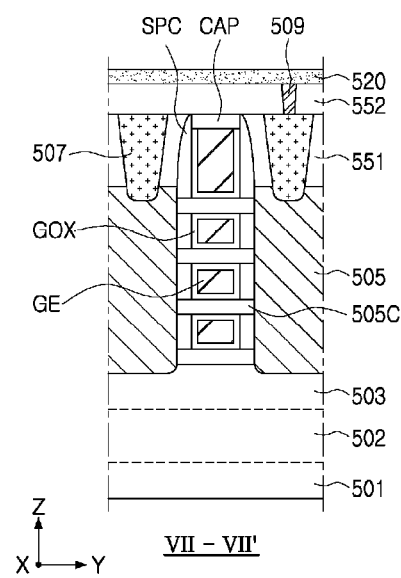

FIGS. 17 to 19 are diagrams illustrating a semiconductor device according to some embodiments.

Referring to FIG. 17, a semiconductor device 500 may include standard cells SC1 to SC4 and filler cells FC1 and FC2 disposed in filler cell regions among the standard cells SC1 to SC4. The standard cells SC1 to SC4 may be disposed in the first direction (Y axis direction) and the second direction (X axis direction), and may include gate lines 510, 511, and 512 disposed with a certain gap therebetween. Power wiring patterns 521 and 522 may be disposed on boundaries between the standard cells SC1 to SC4 and the filler cells FC1 and FC2. The power wiring patterns 521 and 522 may be separated from each other in the first direction and may extend in the second direction.

The semiconductor device 500 may include lower wiring patterns 520 extending in the second direction, and the number of the lower wiring patterns 520 may vary, and the present inventive concept is not limited the numbers shown in FIG. 17. At least a portion of the lower wiring patterns 520 may be electrically connected to each other by at least one of filler contacts 507 and 508 included in the filler cells FC1 and FC2. The filler contacts 507 and 508 may include wiring filler contacts 507 used to a routing process for connecting at least a portion of the lower wiring patterns 520, and dummy filler contacts 508 which are not used in the routing process. For example, the wiring filler contacts 507 may be connected to the lower wiring patterns 520 by lower vias 509 extending in the third direction (Z axis direction).

The filler contacts 507 and 508 may be designed in accordance with the lower wiring patterns 520 connected to the wiring filler contacts 507. For example, a position and a length of each of the wiring filler contacts 507 may be determined in accordance with positions of the lower wiring patterns 520 connected to the wiring filler contacts 507. The dummy filler contacts 508 may be disposed in regions in which the wiring filler contacts 507 are not disposed. Accordingly, a routing region may be secured upwardly and downwardly of the lower wiring patterns 520. According to some embodiments of the present inventive concept, multiple lower wiring patterns in standard cells (e.g., 520 in FIGS. 17 through 19) may be electrically connected to each other through a conductive element that is provided above or below these lower wiring patterns. Stated differently, according to some embodiments, both regions above and below lower wiring patterns may include conductive elements used for routing of these lower wiring patterns.

Contact separation regions CD1 and CD2 may be disposed between the filler contacts 507 and 508. For example, referring to FIG. 17, the filler contacts 507 and 508 disposed in the same position in the second direction may be separated from each other in the first direction by the contact separation regions CD1 and CD2. For example, the contact separation regions CD1 and CD2 may include the first contact separation region CD1 and the second contact separation region CD2. The first contact separation region CD1 may be disposed in a position different from positions of the power wiring patterns 521 and 522. In some embodiments, the first contact separation region CD1 may be disposed in one of the filler cells FC1 and FC2. The second contact separation region CD2 may be disposed in a position the same as a position of at least one of the power wiring patterns 521 and 522 in the first direction. The second contact separation region CD2 may be disposed below at least one of the power wiring patterns 521 and 522.

FIG. 18 is a cross-sectional diagram taken along line the VI-VI' in FIG. 17, and FIG. 19 is a cross-sectional diagram taken along line the VII-VII' in FIG. 17. Referring to FIGS. 18 and 19, the semiconductor device 500 may include a substrate 501, base regions 502 formed on the substrate 501, active regions 503 formed on the base regions 502, and a substrate insulating layer 504 surrounding the active regions 503. In FIGS. 18 and 19, the active regions 503 may be filler active regions included in the filler cells.

Referring to FIG. 19, channel regions 505C of each of the semiconductor devices included in the semiconductor device 500 may be separated from the active regions 503 in the third direction. The channel regions 505C may connect source/drain regions 505 to each other on the active regions 503, and the channel regions 505C may be surrounded by the gate lines 510 to 512.

Each of the gate lines 510 to 512 may include a gate spacer SPC, a gate electrode GE, and a capping layer CAP. Referring to FIGS. 18 and 19, the source/drain regions 505 in each of the filler cells FC1 and FC2 may be connected to the filler contacts 507 and 508. According to example embodiments illustrated in FIG. 19, upper surfaces of the filler contacts 507 and 508 may be coplanar with an upper surface of the capping layer CAP, but the present inventive concept is not limited thereto.

Referring to FIG. 18, the wiring filler contact 507 of the filler contacts 507 and 508, used to connect the lower wiring patterns 520 to each other, may extend further than each of the filler cells FC1 and FC2 in the first direction. Accordingly, the wiring filler contact 507 may intersect at least one of the power wiring patterns 521 and 522. In some embodiments, the filler contacts 507 and 508 may be formed of a metal, a metal silicide material, or the like, and may be formed of a material different from materials of the lower wiring patterns 520 and the power wiring patterns 521 and 522. For example, the filler contacts 507 and 508 may be formed of tungsten, tungsten silicide, or the like, and the lower wiring patterns 520 and the power wiring patterns 521 and 522 may be formed of copper.

Figure 20:
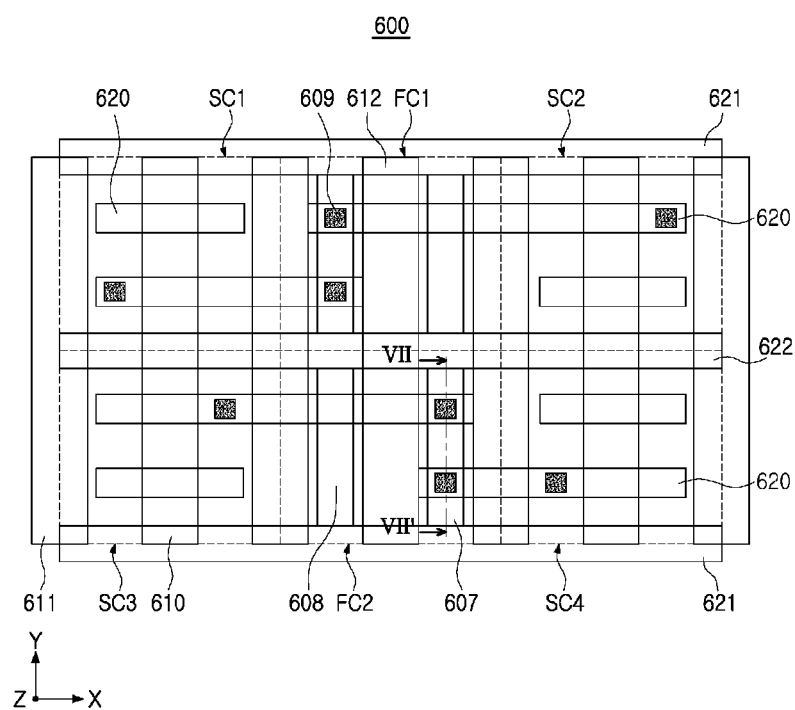
FIGS. 20 and 21 are diagrams illustrating a semiconductor device according to some embodiments of the present inventive concept.
Figure 21:
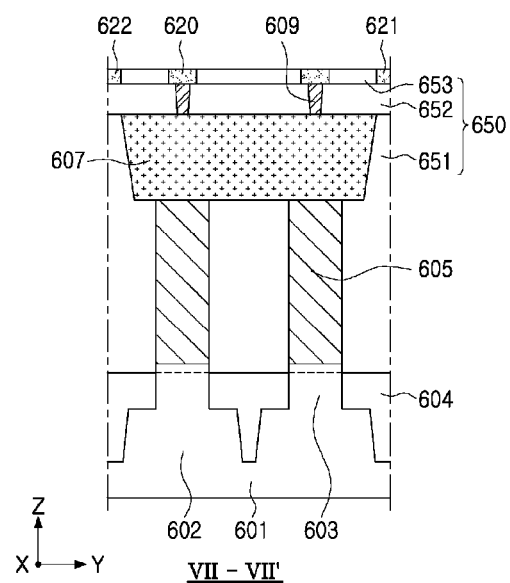

FIGS. 20 and 21 are diagrams illustrating a semiconductor device according to some embodiments.

Referring to FIG. 20, a semiconductor device 600 may include standard cells SC1 to SC4 and filler cells FC1 and FC2. The standard cells SC1 to SC4 and the filler cells FC1 and FC2 may be arranged in the first direction (Y axis direction) and the second direction (X axis direction), and a size of each of the standard cells SC1 to SC4 and the filler cells FC1 and FC2 and arrangement of the standard cells SC1 to SC4 and the filler cells FC1 and FC2 may be varied. Power wiring patterns 621 and 622 may be disposed on boundaries between the standard cells SC1 to SC4 and the filler cells FC1 and FC2. The semiconductor device 600 may include gate lines 610, 611, and 612 extending in the first direction.

Semiconductor elements included in the standard cells SC1 to SC4 may be electrically connected to each other by lower wiring patterns 620. In some embodiments, filler contacts 607 and 608 included in the filler cells FC1 and FC2 may be used as routing regions for electrically connecting the lower wiring patterns 620 to each other. The filler contacts 607 and 608 may electrically connect at least a portion of the lower wiring patterns 620 to each other through lower vias 609.

FIG. 21 is a cross-sectional diagram taken along the line VIII-VIII' in FIG. 20. According to example embodiments illustrated in FIGS. 20 and 21, each of the filler contacts 607 and 608 may have a length which does not go beyond the filler cells FC1 and FC2 in the first direction. For example, the filler contacts 607 and 608 may not intersect power wiring patterns 621 and 622. In other words, the power wiring patterns 621 and 622 may not overlap the filler contacts 607 and 608.

Referring to FIG. 21, the semiconductor device 600 may include a substrate 601, base regions 602, active regions 603 formed on the base regions 602, and a substrate insulating layer 604 surrounding the active regions 603. The active regions 603 may be configured as filler active regions included in filler cells. Source/drain regions 605 may extend from the active regions 603, and may be connected to the filler contacts 607 and 608. In the filler cells FC1 and FC2, the source/drain regions 605 separated from each other in the first direction may be connected to one of the filler contacts 607 and 608 regardless of a conductivity-type of impurities included in each of the source/drain regions 605.

Figure 22:
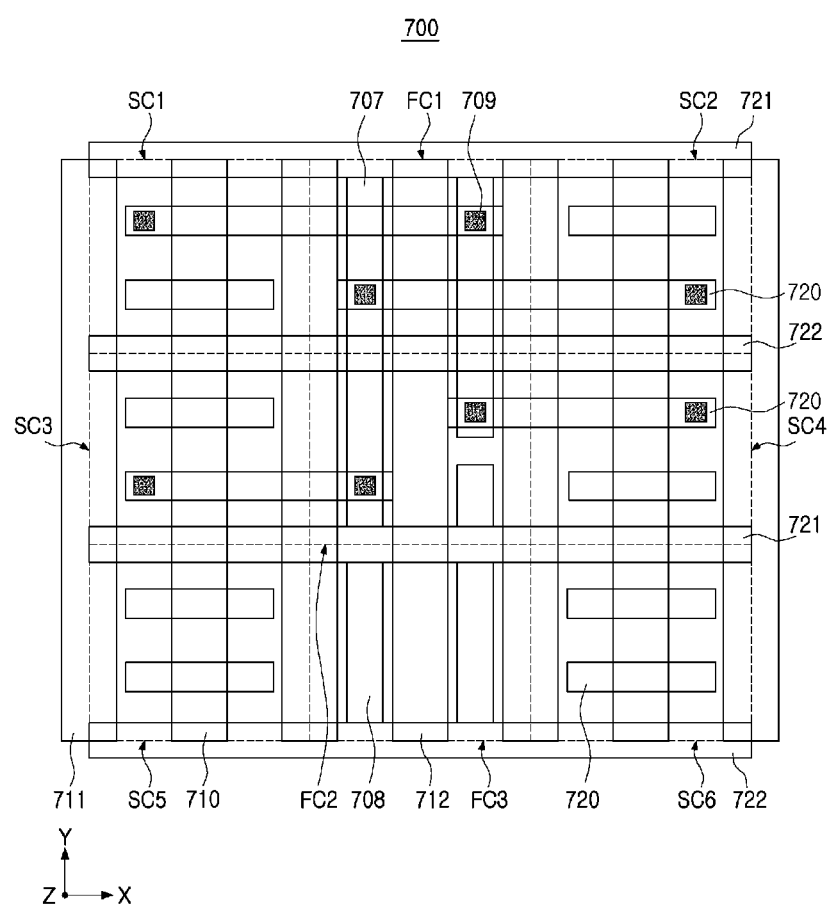
FIG. 22 is diagrams illustrating a semiconductor device according to some embodiments of the present inventive concept.

FIG. 22 is diagrams illustrating a semiconductor device according to some embodiments.

Referring to FIG. 22, a semiconductor device 700 may include standard cells SC1 to SC6 and filler cells FC1, FC2, and FC3. The standard cells SC1 to SC6 and the filler cells FC1 to FC3 may be arranged in the first direction (Y axis direction) and the second direction (X axis direction), and a size of each of the standard cells SC1 to SC6 and the filler cells FC1 to FC3 and arrangement of the standard cells SC1 to SC6 and the filler cells FC1 to FC3 may be varied. Power wiring patterns 721 and 722 may be disposed on boundaries between the standard cells SC1 to SC6 and the filler cells FC1 to FC3. The semiconductor device 700 may include gate lines 710, 711, and 712 extending in the first direction, and lower wiring patterns 720 extending in the second direction.

Semiconductor elements included in the standard cells SC1 to SC6 may be electrically connected to each other by the lower wiring patterns 720. In some embodiments, filler contacts 707 and 708 included in the filler cells FC1 and FC2 may be used as routing regions for electrically connecting the lower wiring patterns 720 to each other. The filler contacts 707 and 708 may include wiring filler contacts 707 connected to lower vias 709 and connecting at least portions of the lower wiring patterns 720 to each other, and dummy filler contacts 708 which are not connected to the lower wiring patterns 720.

The filler cells FC1 and FC2 may include a first filler cell FC1, a second filler cell FC2, and a third filler cell FC3. In some embodiments, the first filler cell FC1 may only include the wiring filler contacts 707, and the second filler cell FC2 may include both the wiring filler contacts 707 and the dummy filler contacts 708. The third filler cell FC3 may only include the dummy filler contacts 708.

FIGS. 23 to 30 are diagrams illustrating a method of manufacturing a semiconductor device according to some embodiments of the present inventive concept.

Figure 23:
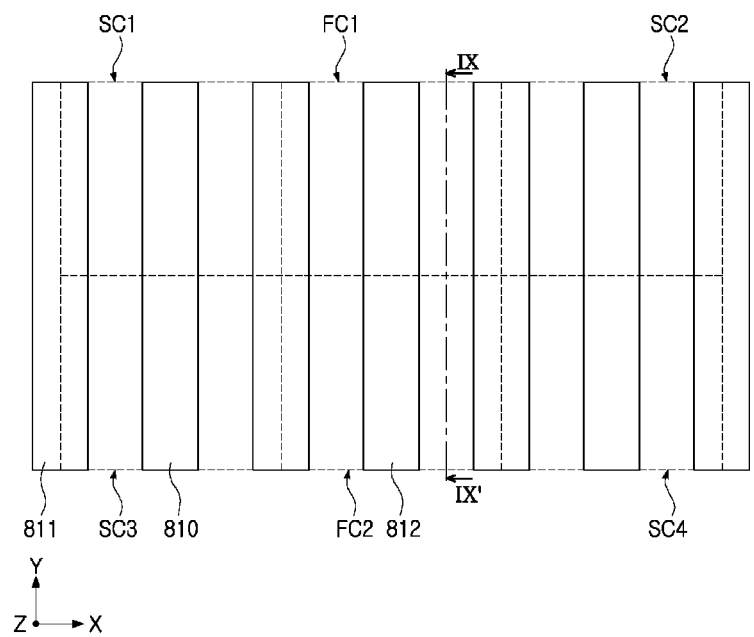
FIGS. 23 to 30 are diagrams illustrating a method of manufacturing a semiconductor device according to some embodiments of the present inventive concept.
Figure 24:
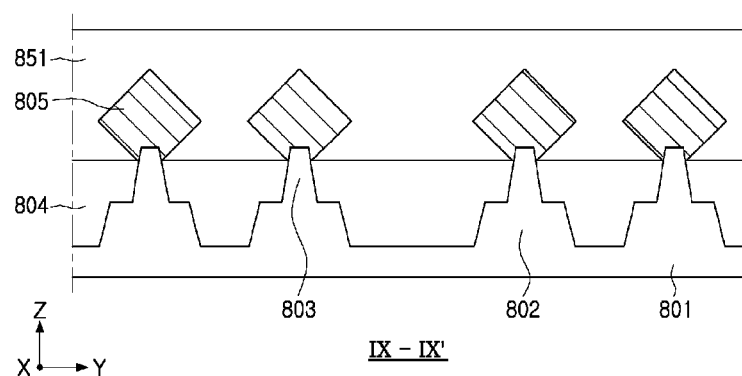

Referring to FIGS. 23 and 24, base regions 802, active regions 803, and source/drain regions 805 may be formed on a substrate 801. FIG. 24 is a cross-sectional diagram taken along the line IX-IX' in FIG. 23. The active regions 803 may include fin structures, and the active regions 803 illustrated in FIG. 24 may be filler active regions included in the filler cells. The substrate 801, the base regions 802, and the active regions 803 may be covered by a substrate insulating layer 804. In some embodiments, the active regions 803 may be configured differently from the aforementioned example embodiments, configured to include a nanosheet. The source/drain regions 805 may be covered by a first interlayer insulating layer 851.

Gate lines 810, 811, and 812 extending in the first direction (Y axis direction) may be disposed between the source/drain regions 805. The gate lines 810 to 812 may include gate electrodes 810, dummy gate electrodes 811, and filler gate electrodes 812. The gate electrodes 810 may provide semiconductor elements along with the source/drain regions 805 in standard cell regions in which the standard cells SC1 to SC4 are disposed. The filler gate electrodes 812 may provide dummy elements along with the source/drain regions 805 in the filler cell regions in which the filler cells FC1 and FC2 are disposed. The dummy gate electrodes 811 may be disposed on boundaries between the standard cell regions and the filler cell regions. In some embodiments, at least a portion of the gate lines 810 to 812 may have different lengths in the first direction.

Figure 25:
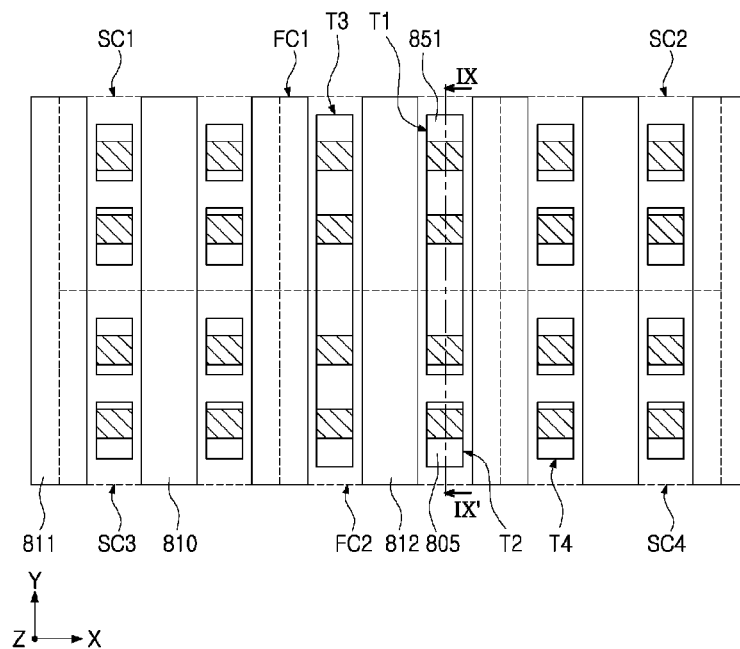
Figure 26:
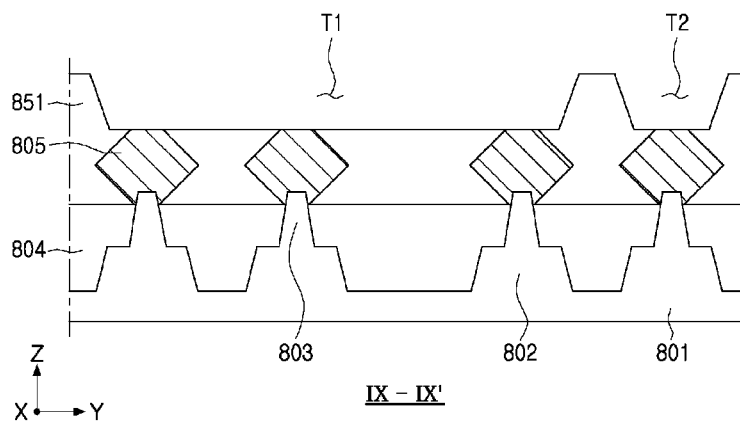

Referring to FIGS. 25 and 26, a plurality of trenches T1 to T4 may be formed by partially removing the first interlayer insulating layer 851. A position and a length of each of the trenches T1 to T4 may be determined in accordance with a rule of a design of filler contacts formed in the filler cell regions and a rule of a design of active contacts formed in the standard cell regions. In the trenches T1 to T4, at least a portion of the source/drain regions 805 may be exposed.

At least a portion of the trenches T1 to T3 formed in the filler cell regions may extend further than the trenches T4 formed in the standard cell regions. According to example embodiments illustrated in FIGS. 25 and 26, the first trenches T1 and the third trenches T3 may extend further than each of the filler cell regions in the first direction. In some embodiments, one or more of the trenches T1 to T3 in the filler cell regions may have a length in the first direction longer than a length of the fourth trench T4 in the first direction in the standard cell regions as illustrated in FIG. 25.

Figure 27:
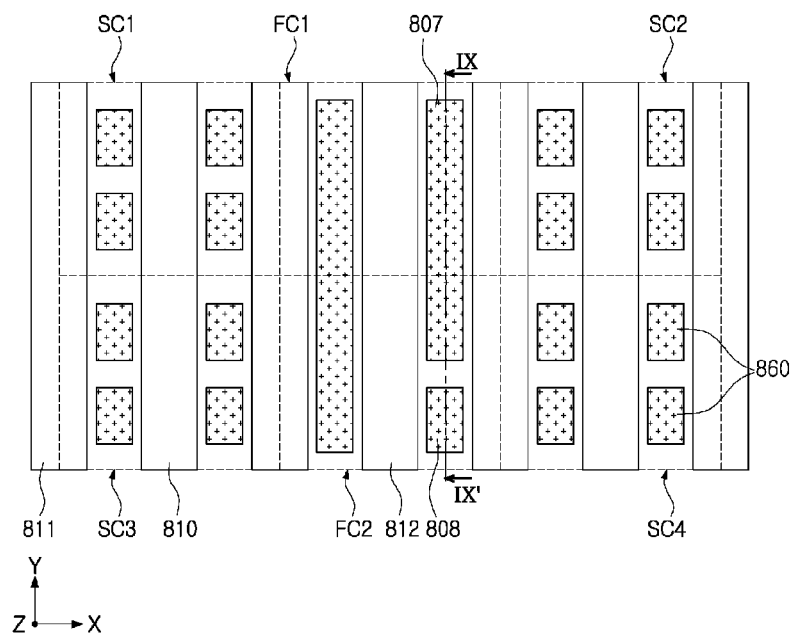
Figure 28:
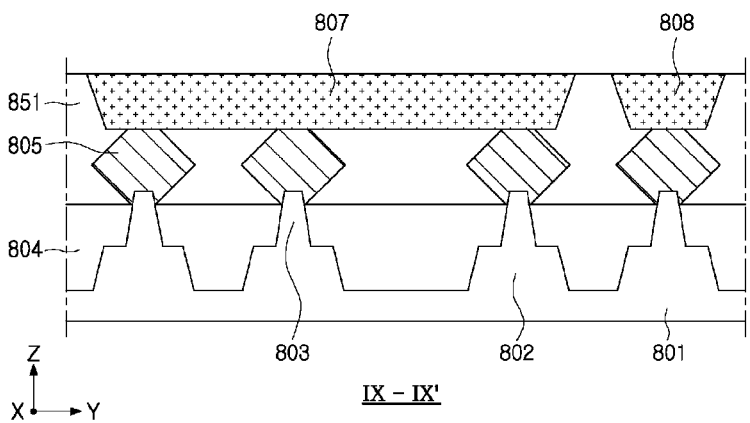

Referring to FIGS. 27 and 28, filler contacts 807 and 808 and active contacts 860 may be formed by filling the trenches T1 to T4 with a conductive material. To form the filler contacts 807 and 808 and the active contacts 860, the trenches T1 to T4 may be filled with, for example, a metal or/and a metal silicide. By filling the trenches T1 to T4 with a metal or/and a metal silicide, the filler contacts 807 and 808 and the active contacts 860 may be simultaneously formed in the same process. In some embodiments, the filler contacts 807 and 808 and the active contacts 860 may be formed of the same material.

Figure 29:
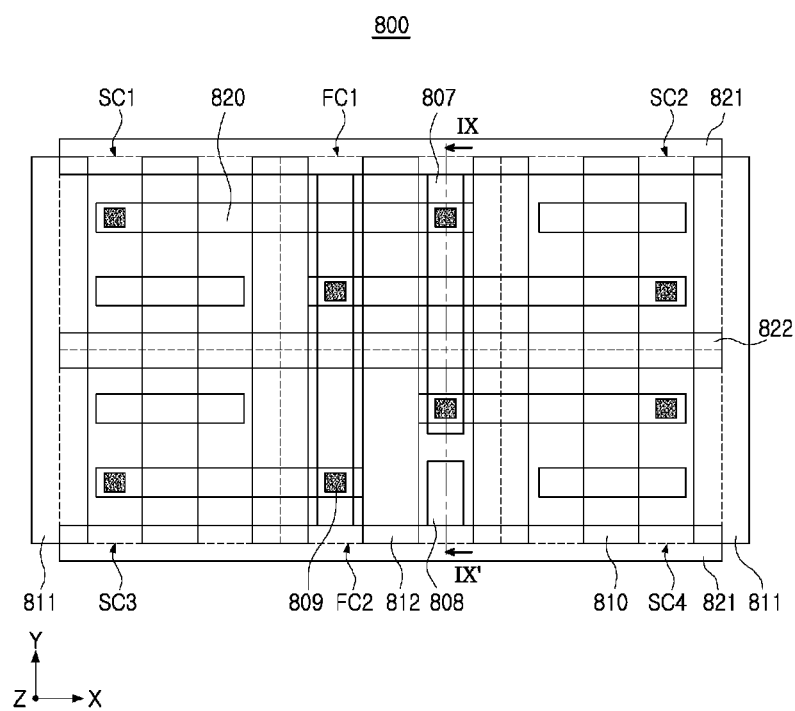
Figure 30:
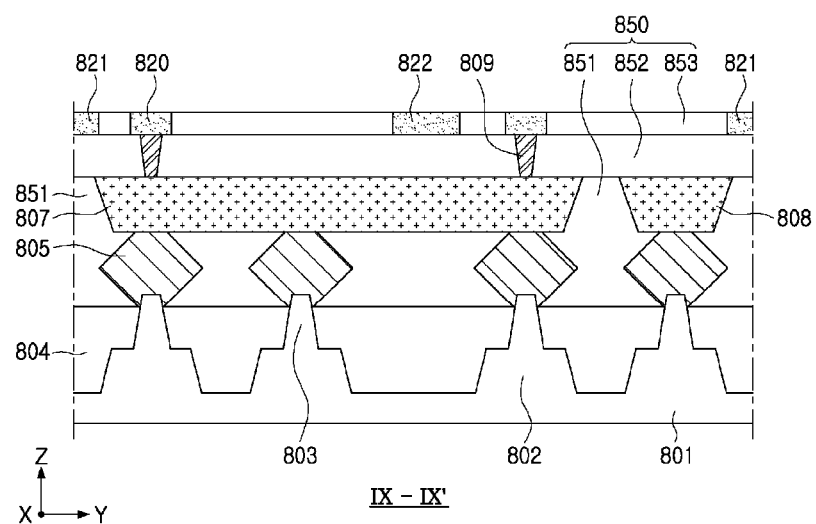

Referring to FIGS. 29 and 30, a process for forming lower vias 809, lower wiring patterns 820, and power wiring patterns 821 and 822 may be performed. At least a portion of the active contacts 860 may be electrically connected to each other by the lower vias 809, the lower wiring patterns 820, and wiring filler contacts 807. In the filler cell regions, a routing region for connecting the lower wiring patterns 820 to each other may also be secured downwardly of the lower wiring patterns 820. Accordingly, integration density of the semiconductor device 800 may improve, and an electrical connection path of the semiconductor elements disposed in the standard cell regions may be designed in an efficient manner such that electrical properties of the semiconductor device 800 may improve. In some embodiments, the lower wiring patterns 820 may be electrically connected to each other through the wiring filler contacts 807 that are provided below the lower wiring patterns 820 as illustrated in FIG. 30.

Referring to FIG. 30, the lower vias 809, the lower wiring patterns 820, and the power wiring patterns 821 and 822 may be covered by a second interlayer insulating layer 852 and a third interlayer insulating layer 853. At least one of the lower wiring patterns 820 and the power wiring patterns 821 and 822 may intersect at least one of the wiring filler contacts 807 on a plane (X-Y plane) in parallel to an upper surface of the substrate 801.

According to example embodiments of the present inventive concept, a semiconductor device including standard cells and filler cells disposed among the standard cells may be provided. At least a portion of the semiconductor devices included in the standard cells may be electrically connected to each other by a filler contact in contact with a filler active region in the filler cell. Accordingly, by disposing wirings for connecting the semiconductor elements on the wiring patterns, disposed on the semiconductor elements, and also on a level the same as a level of the semiconductor elements, integration density or/and electrical properties of the semiconductor device may improve.

While the example embodiments have been shown and described above, it will be apparent to those skilled in the art that modifications and variations could be made without departing from the scope of the present inventive concept. Accordingly, the above-disclosed subject matter is to be considered illustrative, and not restrictive, and the appended claims are intended to cover all such modifications, enhancements, and other embodiments, which fall within the scope of the present inventive concept.

What is claimed is:

1. A semiconductor device, comprising:
   standard cells arranged in a first direction and a second direction on a substrate, wherein both the first direction and the second direction are parallel to an upper surface of the substrate, and the second direction is intersecting the first direction, and wherein each of the standard cells includes semiconductor elements and a lower wiring pattern that is electrically connected to at least one of the semiconductor elements and extends in the second direction; and
   filler cells on the substrate, wherein each of the filler cells is between two standard cells of the standard cells adjacent to each other in the second direction and includes a filler active region and a filler contact that is connected to the filler active region and extends in the first direction,
   wherein the filler cells include a first filler cell between a first standard cell and a second standard cell of the standard cells adjacent to each other in the second direction, and
   the lower wiring pattern of the first standard cell extends into the first filler cell and is connected to the filler contact of the first filler cell, and a lowermost surface of the filler contact of the first filler cell is above the substrate, and an uppermost surface of the filler contact of the first filler cell is below the lower wiring pattern of the first standard cell.

2. The semiconductor device of claim 1, wherein the standard cells include a third standard cell and a fourth standard cell adjacent to each other in the second direction, and the filler cells include a second filler cell between the third and fourth standard cells, and
   wherein the filler contact of the second filler cell includes a dummy filler contact that is spaced apart from the lower wiring patterns of the first, second, third, and fourth standard cells.

3. The semiconductor device of claim 2,
   wherein the standard cells include a fifth standard cell and a sixth standard cell adjacent to each other in the second direction, and the filler cells include a third filler cell between the fifth and sixth standard cells,
   wherein the filler contact of the first filler cell includes first wiring filler contacts, and each of the first wiring filler contacts is connected to at least one of the lower wiring patterns of the first, second, third, fourth, fifth, and sixth standard cells,
   the filler contact of the second filler cell includes a second wiring filler contact that is connected to at least one of the lower wiring patterns of the first, second, third, fourth, fifth, and sixth standard cells and a second dummy filler contact that is spaced apart from the lower wiring patterns of the first, second, third, fourth, fifth, and sixth standard cells, and
   the third filler cell includes third dummy filler contacts that are spaced apart from the lower wiring patterns of the first, second, third, fourth, fifth, and sixth standard cells.

4. The semiconductor device of claim 3, wherein the first wiring filler contacts included in the first filler cell have different lengths in the first direction.

5. The semiconductor device of claim 3, wherein the second wiring filler contact and the second dummy filler contact included in the second filler cell have an equal length in the first direction.

6. The semiconductor device of claim 3, wherein the third dummy filler contacts included in the third filler cell have an equal length in the first direction.

7. The semiconductor device of claim 3, wherein at least one of the first wiring filler contacts included in the first filler cell is electrically connected to the lower wiring patterns extending from two standard cells of the standard cells, and the two standard cells of the standard cells are not aligned in the first direction and the second direction.

8. The semiconductor device of claim 3, wherein at least one of the first wiring filler contacts included in the first filler cell is electrically connected to the lower wiring patterns extending from two standard cells of the standard cells, and the two standard cells of the standard cells are not aligned in the first direction and are aligned in the second direction.

9. The semiconductor device of claim 3, wherein the second wiring filler contact included in the second filler cell is electrically connected to the lower wiring patterns extending from two standard cells of the standard cells, and the two standard cells of the standard cells are not aligned in the first direction and are aligned in the second direction.

10. The semiconductor device of claim 1, further comprising:
at least one via structure connecting one of the filler contacts with one of the lower wiring patterns.

11. The semiconductor device of claim 1, wherein the filler contacts and the lower wiring patterns include different conductive materials.

12. The semiconductor device of claim 1, further comprising:
at least one contact separation region separating two filler contacts that are aligned in the first direction.

13. The semiconductor device of claim 12, wherein the at least one contact separation region includes a first contact separation region that is spaced apart from power wiring patterns in the first direction, and each of the power wiring patterns is on a respective boundary between two filler cells of the filler cells adjacent to each other in the first direction.

14. The semiconductor device of claim 13, wherein the at least one contact separation region further includes a second contact separation region different from the first contact separation region, and the second contact separation region is disposed below at least one of the power wiring patterns.

15. A semiconductor device, comprising:
a standard cell region and a filler cell region adjacent to each other in a first direction that is parallel to an upper surface of a substrate;
at least one semiconductor element in the standard cell region;
at least one dummy element and a filler contact in the filler cell region;
a lower wiring pattern above the least one semiconductor element and continuously extending from the standard cell region into the filler cell region in the first direction, the lower wiring pattern comprising a portion in the filler cell region; and
a via structure in the filler cell region, wherein an uppermost surface of the via structure is below the portion of the lower wiring pattern, and a lowermost surface of the via structure is above the filler contact, and the via structure is in contact with the portion of the lower wiring pattern and is in contact with the filler contact.

16. The semiconductor device of claim 15,
wherein the filler contact of the filler cell region includes a wiring filler contact in contact with the via structure and a dummy filler contact spaced apart from the via structure; and
wherein the dummy filler contact intersects the at least one lower wiring pattern in the filler cell region.

17. The semiconductor device of claim 16, wherein the wiring filler contact and the dummy filler contact have different lengths in a second direction that intersects the first direction.

18. The semiconductor device of claim 16, wherein the wiring filler contact is connected to a second lower wiring pattern different from the at least one lower wiring pattern.

19. A semiconductor device, comprising:
first and second standard cells on a substrate, wherein each of the first and second standard cells includes a semiconductor element and a lower wiring pattern electrically connected to the semiconductor element; and
a filler cell that is between the first and second standard cells and includes a first filler active region and a first filler contact that is electrically connected to the first filler active region and extends longitudinally in a first direction that is parallel to an upper surface of the substrate,
wherein the first and second standard cells are spaced apart from each other in a second direction that intersects the first direction, and
each of the lower wiring patterns of the first and second standard cells extends into the filler cell, comprises a lowermost surface that is above the first filler contact, overlaps the first filler contact, and is electrically connected to the first filler contact.

20. The semiconductor device of claim 19, wherein the filler cell further comprises a second filler active region and a second filler contact that is electrically connected to the second filler active region, and
wherein a length of the first filler contact is less than a length of the second filler contact in the first direction.

* * * * *